United States Patent [19]
Aoki et al.

[11] Patent Number: 5,849,403
[45] Date of Patent: Dec. 15, 1998

[54] ORGANIC THIN FILM DEVICE

[75] Inventors: Shinya Aoki, Kawasaki; Toshio Nakayama, Fujisawa, both of Japan

[73] Assignee: Kabushiki Kaisha Toshiba, Kawasaki, Japan

[21] Appl. No.: 713,469

[22] Filed: Sep. 13, 1996

[30] Foreign Application Priority Data

Sep. 13, 1995 [JP] Japan ................................ 7-235836
Feb. 15, 1996 [JP] Japan ................................ 8-027555

[51] Int. Cl.$^6$ ........................................................ B32B 7/02
[52] U.S. Cl. ........................... 428/220; 252/589; 359/240; 359/245; 359/265; 365/106; 365/118; 365/119
[58] Field of Search .............................. 428/220; 365/106, 365/118, 119; 252/589; 359/240, 245, 265

[56] References Cited

U.S. PATENT DOCUMENTS

| | | | |
|---|---|---|---|
| 5,061,509 | 10/1991 | Naito et al. | 427/497 |
| 5,144,473 | 9/1992 | Gemma et al. | 359/270 |
| 5,155,566 | 10/1992 | Nakayama et al. | 247/40 |
| 5,240,762 | 8/1993 | Miura et al. | 428/220 |

OTHER PUBLICATIONS

R. Wheland et al., J. Amer. Chem. Soc., 98(13), 3916–3925, Jun. 6, 1976.

Phys. Rev. B: Condens. Matter, 52(3), 1549–1565. S. Tanaka et al, Jul. 1995.

Journal of the Physical Society of Japan, vol. 53, No. 12, pp. 4445–4455, Dec. 1984, Yoshinori Tokura, et al., "Effect of Substitutional Impurities on the Neutral–to–Ionic Phase Transition in TTF–P–Chloranil Crystal".

*Primary Examiner*—Mary E. Ceperley
*Attorney, Agent, or Firm*—Oblon, Spivak, McClelland, Maier & Neustadt, P.C.

[57] ABSTRACT

Disclosed is an organic thin film device having an organic thin film consisting of a mixed-stacked charge-transfer complex, wherein the organic thin film contains n species of donor molecule $D_1 \ldots D_n$ and m species of acceptor molecule $A_1 \ldots A_m$ and forms mixed crystal represented by $(D_1)_{x1} \ldots (D_n)_{xn}-(A_1)_{y1} \ldots (A_m)_{ym}$ and the combinations of a donor molecule and an acceptor molecule consist of a group forming ionic complex crystal and a group forming neutral complex crystal.

14 Claims, 6 Drawing Sheets

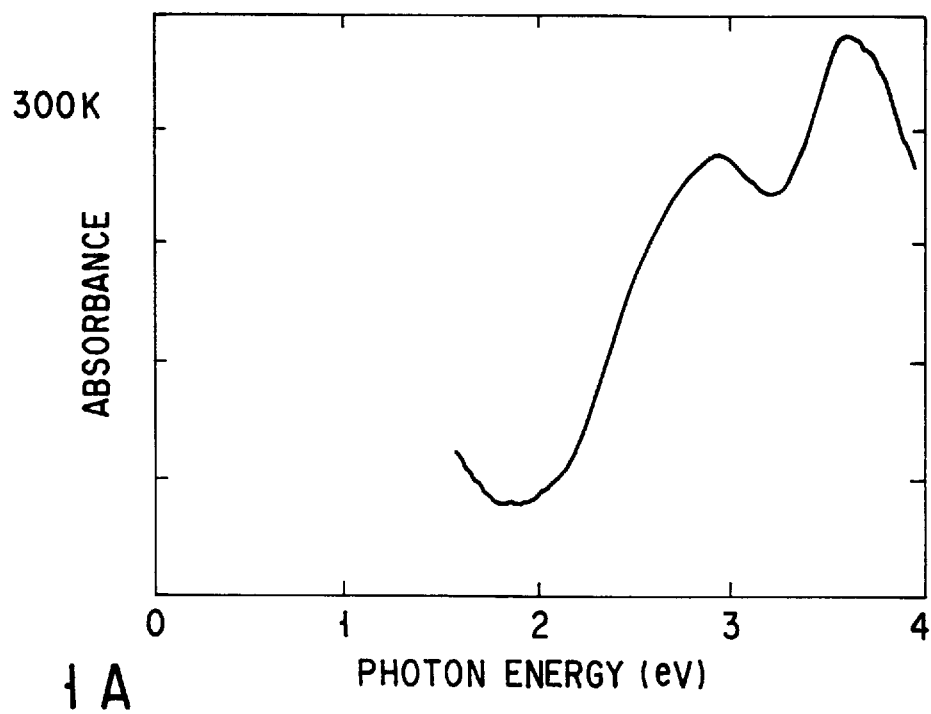
F I G. 1A
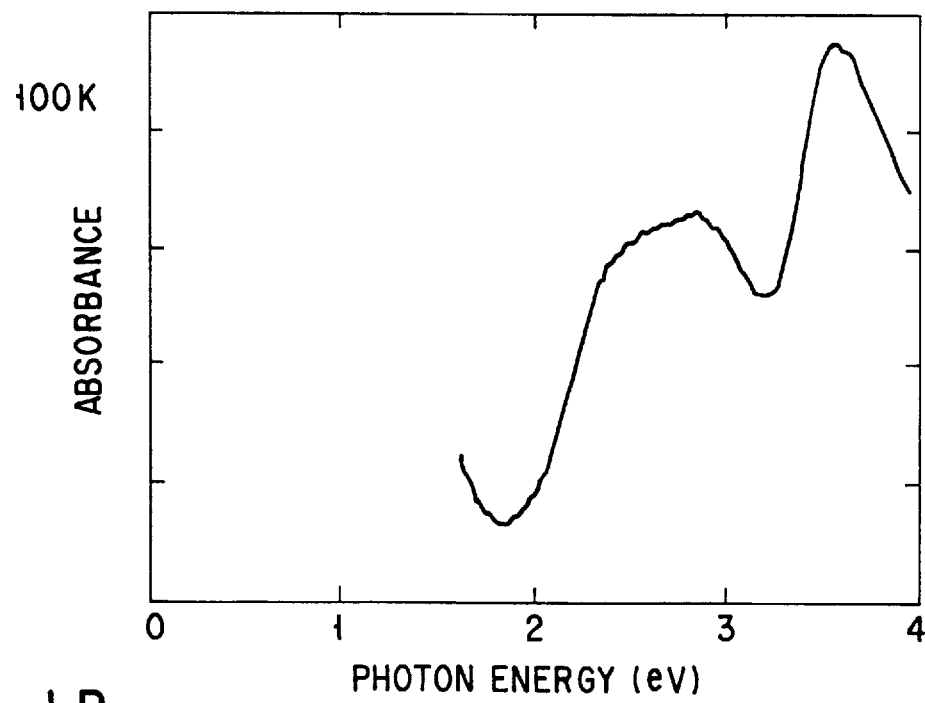
F I G. 1B

|  |  |
|---|---|
| PVDF | ~64 |
| (DClPD)₀.₈₅(ClMePD)₀.₁₅ – ClMeDCNQI | ~63 |
| PVDF | ~62 |
| DClPD – ClMePCNQI | ~61 |
F I G. 7
|  |  |
|---|---|
| PVDF | ~74 |
| (DClPD)₀.₈₅(ClMePD)₀.₁₅ – ClMeDCNQI | ~73 |
| PVDF | ~72 |
| ClMePD – DMeDCNQI | ~71 |
F I G. 8
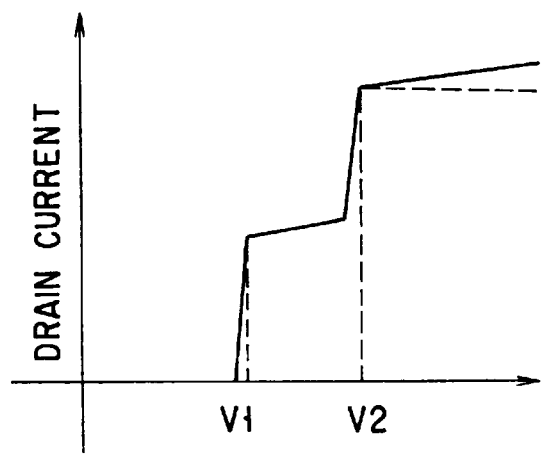
F I G. 9

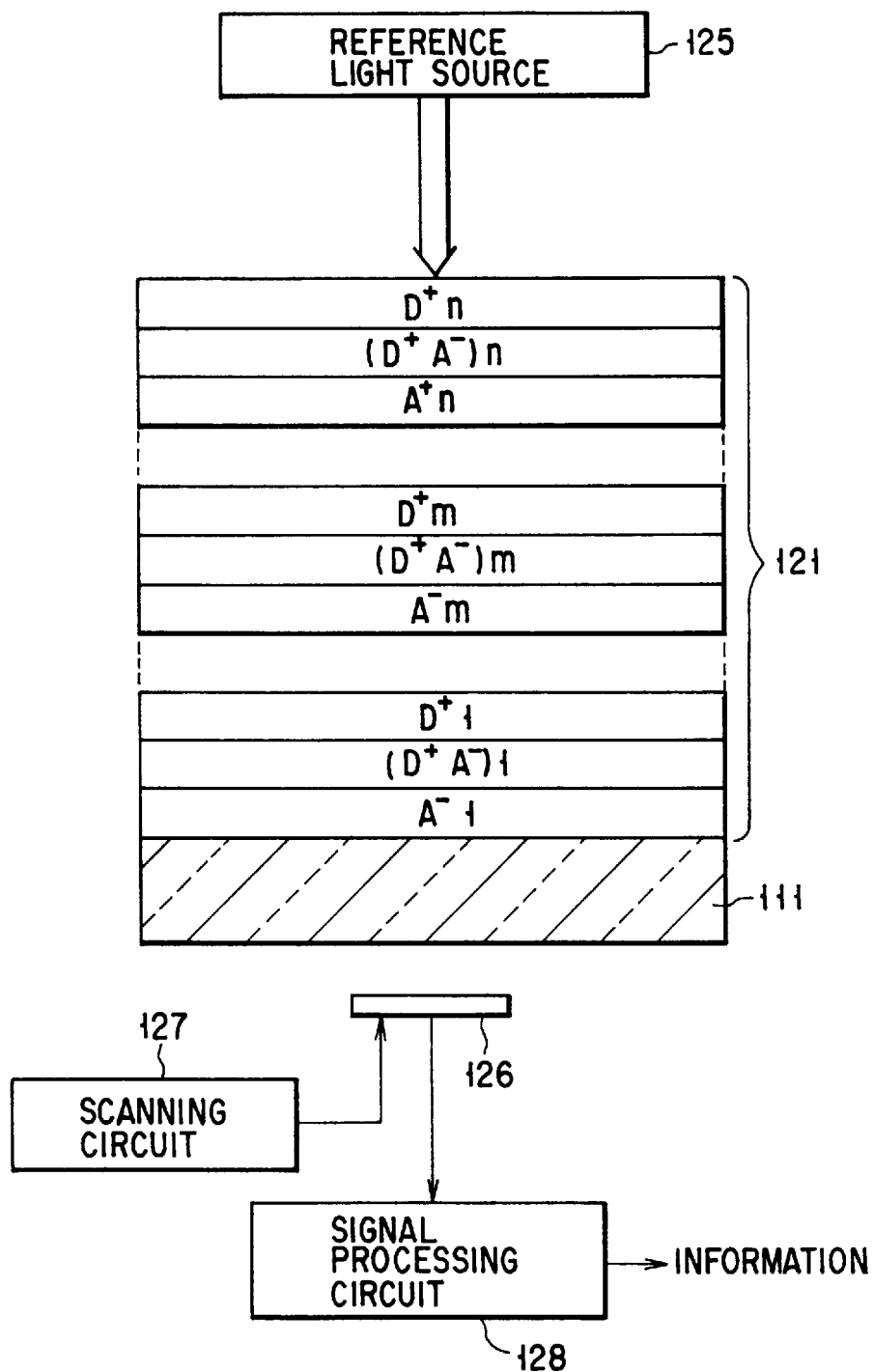
F I G. 12

ORGANIC THIN FILM DEVICE

BACKGROUND OF THE INVENTION

1. Field of the Invention

The present invention relates to an organic thin film device.

2. Description of the Related Art

The research has recently been activated to realize a new functional device by use of an organic molecule. From the viewpoint of application to a device, much attention has been paid to the phenomenon of intermolecular charge transfer observed for organic molecule materials. As a typical example of this phenomenon, attention is taken of a mixed-stacked charge-transfer complex (DA complex) consisting of a donor molecule (D molecule) and an acceptor molecule (A molecule). It is known that various combinations of D and A molecules make the DA complex neutral with less charge transfer between the D and A molecules or ionized with large charge transfer. The DA complex shows various optical characteristics or electric characteristics depending on its state. It is known that some DA complexes, such as tetrathiafulvalene-chloranil (TTF-CA), undergo transition from a neutral state to an ionic state (NI transition) depending on temperature or pressure, and such transition is accompanied by changes in optical characteristics and electric characteristics (J. B. Torrance et al., Phys. Rev. Lett. 46, 253 (1981); Y. Tokura et al., Physica 143B, 527 (1986)).

When the phenomenon of charge transfer in the DA complex is applied as the working principle of an electric device or optical device, it is important how the change between such charge transfer states can be caused efficiently and controlled by an electric field or light.

To easily induce such change from the neutral state to the ionic state by an electric field or light, it is essential to employ a DA complex with a small energy difference between the neutral ground state and the ionic excited state. Complex species with a small energy difference between these states include complexes cause temperature-induced NI transition. However, only few complexes represent temperature-induced NI transition have been reported, and these include 3,3',5,5'-tetramethylbenzidine-tetracyanoquinodimethane (TMB-TCNQ) (Y. Iwasa et al., Phys. Rev. B42, 2374 (1990)) and dimethyltetrathiafulvalene-chloranil (DMTTF-CA) (S. Aoki et al., Phys. Rev. B48, 626 (1993)) in addition to the aforementioned tetrathiafulvalene-chloranil (TTF-CA). Therefore, the number of applicable DA complex species is limited and the manufacturing of a device with desired optical and/or electric characteristics has been difficult.

SUMMARY OF THE INVENTION

It is an object of the present invention to provide an organic thin film device such as a display device, which has an organic thin film capable of controlling the energy difference between the neutral ground state and the ionic excited state.

The organic thin film device according to the present invention comprises an organic thin film consisting of a mixed-stacked charge-transfer complex forming mixed crystal having donor and acceptor organic molecules stacked alternatively with each other, at least one of said donor and acceptor containing two or more molecular species, wherein combinations of a donor molecule and an acceptor molecule consist of a group forming ionic complex crystal and a group forming neutral complex crystal.

In the present invention, the organic thin film includes n species of donor molecules $D_1 \ldots D_n$ and m species of acceptor molecules $A_1 \ldots A_m$ (n and m are positive integers satisfying n+m>2). The term "mixed-stacked charge-transfer complex" refers to a complex having a plurality of columns located adjacent to one another, each being a one-dimensional column formed by donor molecule $D_i$ (i=1 to n) and acceptor molecule $A_j$ (j=1 to m) arranged in the form of $\ldots D_iA_jD_iA_jD_iA_j \ldots$ in the thickness direction of the organic thin film. For example, in a mixed-stacked charge-transfer complex consisting of two species of donor molecules $D_1$, $D_2$ and one species of acceptor molecule A, a one-dimensional column in the form of $\ldots D_1AD_2AD_1AD_2A \ldots$ is formed. On the other hand, in a mixed-stacked charge-transfer complex consisting of one species of donor molecule D and two species of acceptor molecules $A_1$, $A_2$, a one-dimensional column in the form of $\ldots DA_1DA_2DA_1DA_2 \ldots$ is formed.

In the present invention, at least one of the donor and acceptor contains two or more molecular species so that the resulting mixed-stacked charge-transfer complex forms mixed crystal. Such mixed-stacked charge-transfer complex forming the mixed crystal is represented by:

$(D_1)_{x1} \ldots (D_n)_{xn}-(A_1)_{y1} \ldots (A_m)_{ym}$, where $x_i$ (i=1 to n) is the molar fraction of donor molecule $D_i$; $y_j$ (j=1 to m) is the molar fraction of acceptor molecule Aj; $x_1+ \ldots +x_n=1$; and $y_1+ \ldots +y_m=1$.

In the present invention, the combinations of a donor molecule $D_i$ and an acceptor molecule $A_j$ in the organic thin film consist typically of a group forming ionic complex crystal and a group forming neutral complex crystal. The complex crystal herein refers mainly to the mixed-stacked charge-transfer complex crystal.

In the present invention, the temperature at which a combination of a donor molecule $D_i$ and an acceptor molecule $A_j$ forms ionic or neutral complex crystal is 85° K or more, preferably room temperature or ambient temperature. The term "room temperature" in the present specification is used to mean that no cooling means or heating means is required, and specifically it is in the range of about −30° to 60° C.

BRIEF DESCRIPTION OF THE DRAWINGS

FIGS. 1A and 1B show ultraviolet-visible absorption spectra of ClMePD-DMeDCNQI complex crystal at different temperatures;

FIG. 7 is a drawing of the laminate structure of the organic thin film constituting FET;

FIG. 8 is a drawing of the laminate structure of the organic thin film constituting FET;

FIG. 9 is a graph showing the output characteristics of FET;

FIG. 12 is a schematic drawing for explaining a read-out method for the optical recording device of the present invention.

DETAILED DESCRIPTION OF THE PREFERRED EMBODIMENTS

Figure 2A:
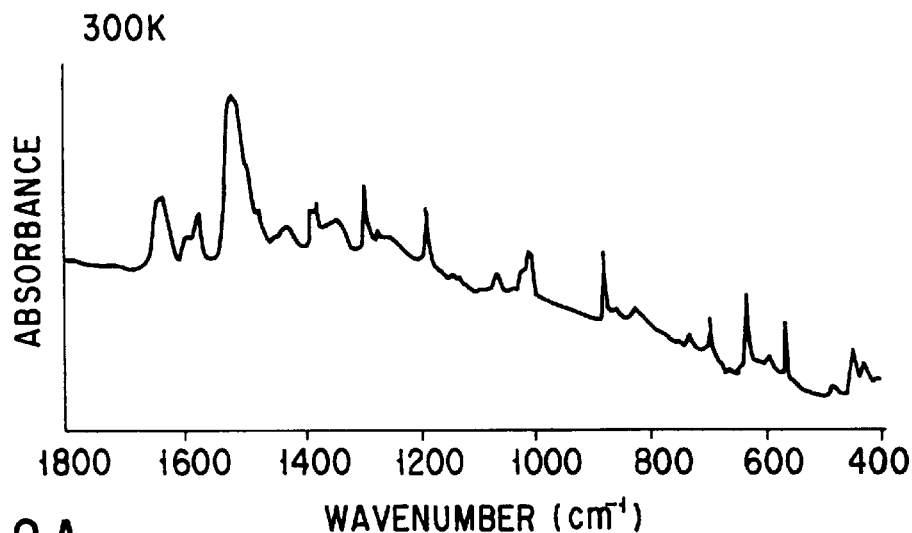
FIGS. 2A and 2B show infrared absorption spectra of ClMePD-DMeDCNQI complex crystal at different temperatures.

In the organic thin film device of the present invention, the mixed-stacked charge-transfer complex forming the mixed crystal constituting the organic thin film can reduce the energy difference between the neutral ground state and the ionic excited state. Hereinafter, the reason for this is described.

First, we think of the energy difference $E_I-E_N$ between the neutral ground state and the ionic excited state for DA complex consisting of one species of donor D and one species of acceptor A. Here, I is assigned to the ionization potential of donor D, and E is assigned to the electron affinity of acceptor A. This energy difference is expressed in terms of the ionization energy I–E of D and A molecules as well as Madelung energy $E_M$ in a pair of DA in the ionized DA complex, as follows:

$$E_I-E_N=I-E-|E_M|$$

The DA complex is neutral if $I-E-|E_M|>0$, and the DA complex is ionized if $I-E-|E_M|<0$. The ionization energy I–E is an intrinsic value to a molecular species constituting the DA complex. The Madelung energy $|E_M|$ is known to be a nearly constant value of about 4.1 eV, which is independent of the complex used (J. B. Torrance et al., Phys. Rev. Lett., 46, 253 (1981)). Hence, the value of $E_I-E_N$ is determined approximately depending on the selected D and A molecules and it is therefore difficult to control this value. For this reason, the number of complex species represent NI transition is limited and their application to devices has been difficult, as described above.

On the other hand, the organic thin film device of the present invention can arbitrarily control the ionization energy I–E of DA complex by use of the mixed crystal consisting of n species of donor $D_1 \ldots D_n$ and m species of acceptor $A_1 \ldots A_m$ where n and m are integers satisfying n+m>2, as described below.

Let us think of a simple model for the organic thin film where the mixed crystal consists of two species of donor $D_1$ and $D_2$ and one species of acceptor A, i.e., $(D_1)_{x1}(D_2)_{x2}-A$ where $x_1+x_2=1$ (referred to hereinafter as mixed crystal 1).

Here, if $I_1$ and $I_2$ are assigned respectively to the ionization potentials of the two species of donors $D_1$ and $D_2$ in the mixed crystal, then the average value I of the ionization potentials of the donors is expressed as $I=x_1I_1+x_2I_2$. If E is assigned to the electron affinity of the acceptor A, then the ionization energy I–E of the complex is expressed as follows:

$$I-E=(x_1I_1+x_2I_2)-E \qquad (i)$$

Madelung energy is a nearly constant value (about 4.1 eV) for both $D_1$–A complex and $D_2$–A complex, and this energy is a nearly constant value of about 4.1 eV for mixed crystal 1, as well, regardless of the complex species and component ratio.

If the equation (i) is substituted for $E_I-E_N=I-E-|E_M|$, we obtain the energy difference $E_I-E_N$ between the ionic excited state and the neutral ground state in the mixed crystal 1, as follows:

$$E_I-E_N=(x_1I_1+x_2I_2)-E-|E_M| \qquad (ii)$$

The equation (ii) indicates that the value of $E_I-E_N$ can be controlled by controlling the molar ratios of the two donors.

For example, if $D_1$–A forms neutral complex crystal and $D_2$–A forms ionic complex crystal, then $|E_I-E_N|$ can be made extremely small. In this case, the relationships $I_1-E-|E_M|>0$ and $I_2-E-|E_M|<0$ can be given. Therefore, there is $x_{NI}$ ($0<x_{NI}<1$) satisfying the equation $E_I-E_N=0$ from the formula (ii). By substituting the equation $x_1=1-x_2$ for the equation (ii), we obtain the value $x_{NI}$ as a specific value of $x_2$ in the following equation:

$$x_{NI}=(I_1-E-|E_M|)/(I_1-I_2) \qquad (iii)$$

Mixed crystal 1 is neutral when $x_2<x_{N1}$ and ionic when $x_{N1}<x_2$. $|E_I-E_N|$ can be significantly made small by reducing $|x_2-x_{NI}|$ by controlling the molar ratios of the two donors.

The foregoing can also apply to another simple model for the organic thin film where the mixed crystal consists of one species of donor D and two species of acceptors $A_1$ and $A_2$, i.e., $D-(A_1)_{y1}(A_2)_{y2}$ where $y_1+y_2=1$ (referred to hereinafter as mixed crystal 2).

Here, if I is designated to the ionization potential of the donor D and $E_1$ and $E_2$ to the electron affinities of the two acceptors $A_1$ and $A_2$ respectively in the mixed crystal 2, then the ionization energy I–E of the complex is expressed as follows:

$$I-E=I-(y_1E_1+y_2E_2) \qquad (i')$$

Madelung energy is a nearly constant value of about 4.1 eV for the mixed crystal 2 as well, regardless of its complex species and component ratio. Hence, if the equation (i') is substituted for $E_I-E_N=I-E-|E_M|$, we obtain the energy difference between the ionic excited state and the neutral ground state in the mixed crystal 2, as follows:

$$E_I-E_N=I-(y_1E_1+y_2E_2)-|E_M| \qquad (ii')$$

The equation (ii') indicates that the value of $E_I-E_N$ can be controlled by controlling the molar ratios of the two acceptors. For example, if $D-A_1$ forms neutral complex crystal and $D-A_2$ forms ionic complex crystal, then the relationships $I-E_1-|E_M|>0$ and $I-E_2-|E_M|<0$ can be given. Therefore, there is $y_{NI}$ ($0<y_{NI}<1$) satisfying $E_I-E_N=0$ from the formula (ii), and this value is given as a specific value of $y_2$ in the following equation:

$$y_{NI}=(I-E_1-|E_M|)/(E_2-E_1) \qquad (iii')$$

Mixed crystal 2 is neutral when $y_2<y_{N1}$ and ionic when $y_{N1}<y_2$. $|E_I-E_N|$ can be significantly made small by reducing $|y_2-y_{NI}|$ by controlling the molar ratios of the two acceptors.

In the foregoing, mixed crystals 1 and 2 are described as simple models. Moreover, $|E_I-E_N|$ can be made extremely small by controlling the molar ratios of donor and/or acceptor in other mixed crystal, such as mixed crystal consisting of two species of donor and two species of acceptor, or three or more species of donor and/or three or more species of acceptor.

In the present invention, the combinations of donor molecule $D_i$ and acceptor molecule $A_j$ in the organic thin film may contain a group not forming the complex crystal. Even if the combinations of donor and acceptor molecules contain a group not forming the complex crystal, the complex mixed crystal described above can be formed as a whole if another group contained therein forms the complex crystal. Therefore, even a combination of donor molecule and acceptor molecule not forming such complex crystal under normal conditions can be estimated to have the potential ability to form the complex crystal.

The degree of charge-transfer of a pair of donor molecule $D_i$ and acceptor molecule $A_j$ not forming such complex crystal can be predicted on the basis of the relationship between ionization energy I–E and Madelung energy (about 4.1 eV). That is, the combination of donor molecule $D_i$ and acceptor molecule $A_j$ satisfying the relationship I–E<4.1 eV can be assumed to form ionic complex crystal. Further, the combination of the donor molecule $D_i$ and acceptor molecule $A_j$ satisfying I–E>4.1 eV can be assumed to form neutral complex crystal. Therefore, the donor molecule $D_i$ and acceptor molecule $A_j$ in the present invention may consist of a group forming the neutral complex crystal and a group satisfying the relationship I–E<4.1 eV, or of a group forming the ionic complex crystal and a group satisfying the relationship I–E>4.1 eV. It is preferable that the value of I–E is 1 eV or more in the former case, and is 9 eV or less in the latter case.

The combinations of donor molecule $D_i$ and acceptor molecule $A_j$ in the organic thin film according to the present invention may contain a group forming separate stacked complex crystal. As discussed above, even if the combinations of the donor molecule and acceptor molecule contain a group forming the separate stacked complex crystal that is ionic, the complex mixed crystal can be formed as a whole if another group contained therein forms the neutral complex crystal. It follows that the combinations of donor molecule $D_i$ and acceptor molecule $A_j$ according to the present invention may consist of a group forming the neutral complex crystal and a group forming the separate stacked complex crystal.

As described above, the value $|E_I-E_N|$ of the organic thin film in the organic thin film device of the present invention can be made small, thus facilitating NI transition by an electric field or light. Therefore, the organic thin film device is easily applied to, for example, a display device.

The following is examples of donor and acceptor molecules for constituting the organic thin film used in the device according to the present invention, where abbreviations, chemical names, and chemical formulae are represented. Tables 1 and 2 show combinations of donor and acceptor forming ionic complex crystal as well as neutral complex crystal.

(Donor molecule)
aniline [D-1]
N-methylaniline [D-2]
N,N-dimethylaniline [D-3]
PD: p-phenylenediamine [D-4]
ClPD: 2-chloro-p-phenylenediamine [D-5]
ClMePD: 2-chloro-5-methyl-p-phenylenediamine [D-6]
DClPD: 2,5-dichloro-p-phenylenediamine [D-7]
DMePD: 2,5-dimethyl-p-phenylenediamine [D-8]
DAD: diaminodurene [D-9]
TMPD: N,N,N',N'-tetramethyl-PD [D-10]
N,N-DMePD: N,N-dimethyl-PD [D-11]
1,5-dimethylnaphthalene [D-12]
1,8-dimethylnaphthalene [D-13]
benzidine [D-14]
TMB: 3,3',5,5'-tetramethylbenzidine [D-15]
NNN'N'-TMB: N,N,N',N'-tetramethyl-benzidine [D-16]
DAP: 1,6-diaminopyrene [D-17]
TMDAP: N,N,N',N'-tetramethyl-DAP [D-18]
phenazine [D-19]
$M_2P$: 5,10-dimethyl-5,10-dihydrophenazine [D-20]
$E_2P$: 5,10-diethyl-5,10-dihydrophenazine [D-21]
$Pr_2P$: 5,10-dipropyl-5,10-dihydrophenazine [D-22]
HMP: 5-methyl-5,10-dihydrophenazine [D-23]
$M_6P$: 5,10-dihydro-2,3,5,7,8,10-hexamethylphenazine [D-24]
PTZ: phenothiazine [D-25]
N-MePTZ: N-methylphenothiazine [D-26]
ClPTZ: 2-chlorophenothiazine [D-27]
TDAE: tetrakis(dimethylamino)ethylene
ferrocene [D-28]
dimethylferrocene [D-29]
decamethylferrocene [D-30]
nickellocene
decamethylnickellocene
cobaltocene
TTF: tetratiafulvalene [D-31]
DMTTF: 2,6-dimethyltetratiafulvalene [D-32]
TMTTF: tetramethyltetratiafulvalene [D-33]
DPhTTF: 2,6-diphenyltetratiafulvalene [D-34]
DPhDMTTF: 2,6-diphenyl-3,7-dimethyltetratiafulvalene [D-35]
DBTTF: dibenzotetratiafulvalene [D-36]
OMTTF: octamethylenetetratiafulvalene [D-37]
HMTTF: hexamethylenetetratiafulvalene [D-38]
$TTC_1TTF$ [D-39]
$TTeC_1TTF$ [D-40]
TSF: tetraselenafulvalene [D-41]
TMTSF: tetramethyltetraselenafulvalene [D-42]
HMTSF: hexamethylenetetraselenafulvalene [D-43]
HMTTeF: hexamethylenetetratellurafulvalene [D-44]
TTT: tetratiatetracene [D-45]
TST: tetraselenatetracene [D-46]
BTP: tetraphenylbithiopyralydene [D-47]
naphthalene
anthracene
phenanthrene
pentacene
pyrene
penylene
azulene
acenaphthene
carbazole
acridine (Acceptor molecule)
BQ: p-benzoquinone [A-1]
$R^1R^2R^3R^4BQ(R^1,R^2,R^3,R^4=H,Me,Cl,Br,I,F,CN)$ [A-2]
  $R^1BQ$: 2-$R^1$-BQ($R^1$=Me,Cl,Br) [A-3]
    MeBQ
    ClBQ
    BrBQ
  $R^1R^2BQ$: 2-$R^1$-5-$R^2$-BQ($R^1,R^2$=Me,Cl,Br) [A-4]
    $Me_2BQ$
    $Cl_2BQ$
    ClMeBQ
    $Br_2BQ$
    BrMeBQ
  2-$R^1$-6-$R^2$-BQ($R^1,R^2$=Me,Cl,Br) [A-5]
    2,6-$Cl_2BQ$
    2,6-$Br_2BQ$
    2,6-$Me_2BQ$
$Cl_3BQ$: 2,3,5-trichloro-p-benzoquinone [A-6]
CA: chloranil [A-7]
BA: bromanil [A-8]
IA: iodanil [A-9]
FA: fluoranil [A-10]
DDQ: 2,3-dicyano-5,6-dichloro-p-benzoquinone [A-11]
$Me_4BQ$: tetramethyl-p-benzoquinone [A-12]
o-BQ: o-benzoquinone [A-13]
o-CA: o-chloranil [A-14]
o-BA: o-bromanil [A-15]
NQ: naphthoquinone [A-16]

$R_1R^2R^3R^4R^5R^6NQ$ [A-17]
 $R^1R^2NQ$: 2-$R^1$-3-$R^2$-NQ($R^1,R^2$=Cl,CN) [A-18]
  $Cl_2NQ$: 2,3-dichloronaphthoquinone
  $(CN)_2NQ$: 2,3-dicyanonaphthoquinone
AQ: 9,10-anthraquinone [A-19]
$R^1R^2R^3R^4R^5AQ$ [A-20]
TCNQ: tetracyanoquinodimethane [A-21]
$R^1R^2R^3R^4TCNQ$ [A-22]
 $R^1TCNQ$: 2-$R^1$-TCNQ($R^1$=Me,OMe,F,Cl,Br) [A-23]
  MeTCNQ
  (OMe)TCNQ
  FTCNQ
  CLTCNQ
  BrTCNQ
 $R^1R^2TCNQ$: 2-$R^1$-5-$R^2$-TCNQ($R^1$=Me,Et,Pr,OMe,F,Cl,Br,I) [A-24]
  $Me_2TCNQ$
  $Et_2TCNQ$
  $Pr_2TCNQ$
  $(OMe)_2TCNQ$
  $F_2TCNQ$
  $Cl_2TCNQ$
  $Br_2TCNQ$
  $I_2TCNQ$
  ClMeTCNQ
  BrMeTCNQ
  IMeTCNQ
 $F_4TCNQ$ [A-25]
TCNNQ: tetracyano-1,4-naphthoquinodimethane [A-26]
$R^1R^2R^3R^4R^5R^6TCNNQ$ [A-27]
TCNAQ: tetracyano-9,10-anthraquinodimethane [A-28]
$R^1R^2R^3R^4R^5TCNAQ$ [A-29]
TNAP: tetracyano-2,6-naphthoquinodimethane [A-30]
$F_6TNAP$ [A-31]
TCNDQ [A-32]
$F_8TCNDQ$ [A-33]
DCNQI: dicyanoquinonediimine [A-34]
$R^1R^2R^3R^4DCNQI$ [A-35]
 $R^1DCNQI$: 2-$R^1$-dicyanoquinonediimine($R^1,R^2$=Me,Cl,Br) [A-36]
  MeDCNQI: 2-methyldicyanoquinonediimine
  CLDCNQI: 2-chlorodicyanoquinonediimine
  BrDCNQI: 2-bromodicyanoquinonediimine
 $R^1R^2DCNQI$: 2-$R^1$-5-$R^2$-DCNQI($R^1,R^2$=Me,Cl,Br) [A-37]
  DMeDCNQI: 2,5-dimethyldicyanoquinonediimine
  ClMeDCNQI: 2-methyl-5-dimethyldicyanoquinonediimine
  DClDCNQI: 2,5-dichlorodicyanoquinonediimine
  BrMeDCNQI: 2-bromo-5-dimethyldicyanoquinonediimine
  $Br_2DCNQI$: 2,5-dibromodicyanoquinonediimine
 $Cl_4DCNQI$: 2,3,5,6-tetrachlorodicyanoquinonediimine
 $F_4DCNQI$: 2,3,5,6-tetrafluorodicyanoquinonediimine
DCNNQI: dicyano-1,4-naphthoquinonediimine [A-38]
$R^1R^2R^3R^4R^5R^6DCNNQI$ [A-39]
DCNAQI: dicyano-9,10-anthraquinonediimine [A-40]
$R^1R^2R^3R^4R^5DCNAQI$ [A-41]
TNB: 1,3,5-trinitrobenzene [A-42]
TNF: 2,4,7-trinitro-9-fluorenone [A-43]
DTF: 2,4,7-trinitro-9-fluorenylidenemalononitrile [A-44]
TENF: 2,4,5,7-tetranitro-9-fluorenone [A-45]
DTENF: 2,4,5,7-tetranitro-9-fluorenylidenemalononitrile [A-46]
TCNE: tetracyanoethylene [A-47]
HCBD: hexacyanobutadiene [A-48]
HCNB: hexacyanobenzene [A-49]
TCNB: tetracyanobenzene [A-50]
DCNB: dicyanobenzene [A-51]
PMDA: pyromellitic dianhydride [A-52]

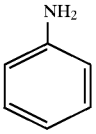 [D-1]

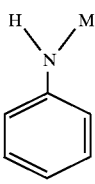 [D-2]

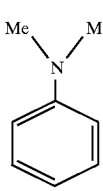 [D-3]

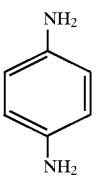 [D-4]

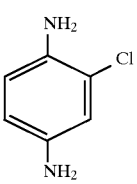 [D-5]

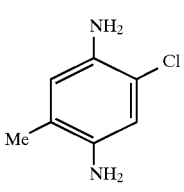 [D-6]

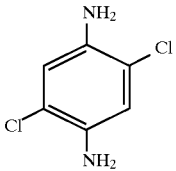 [D-7]

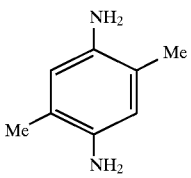 [D-8]

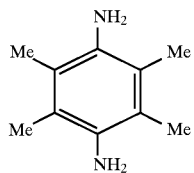  [D-9]
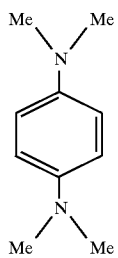  [D-10]
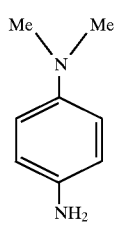  [D-11]
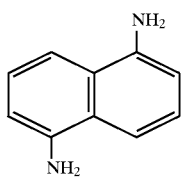  [D-12]
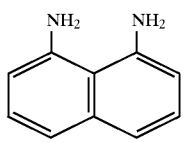  [D-13]
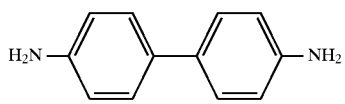  [D-14]
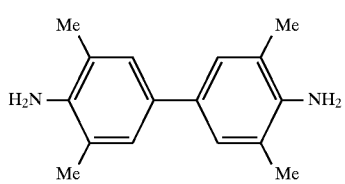  [D-15]
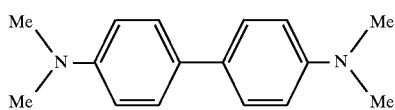  [D-16]
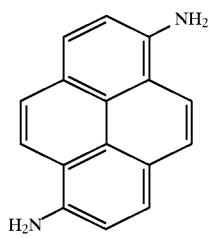  [D-17]
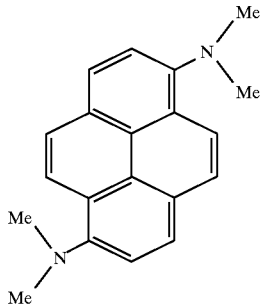  [D-18]
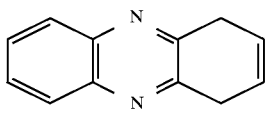  [D-19]
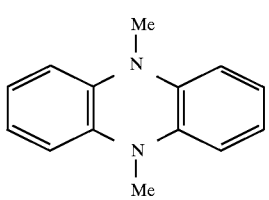  [D-20]
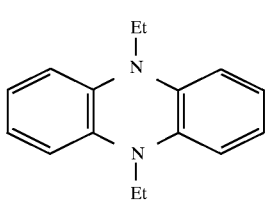  [D-21]
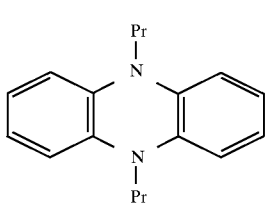  [D-22]
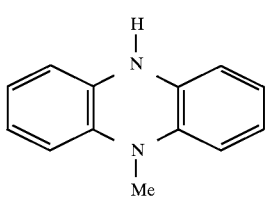  [D-22]
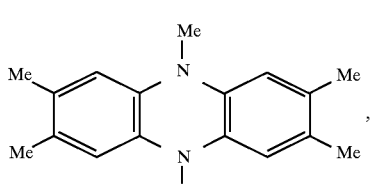  [D-24]
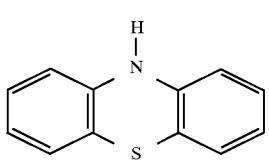  [D-25]

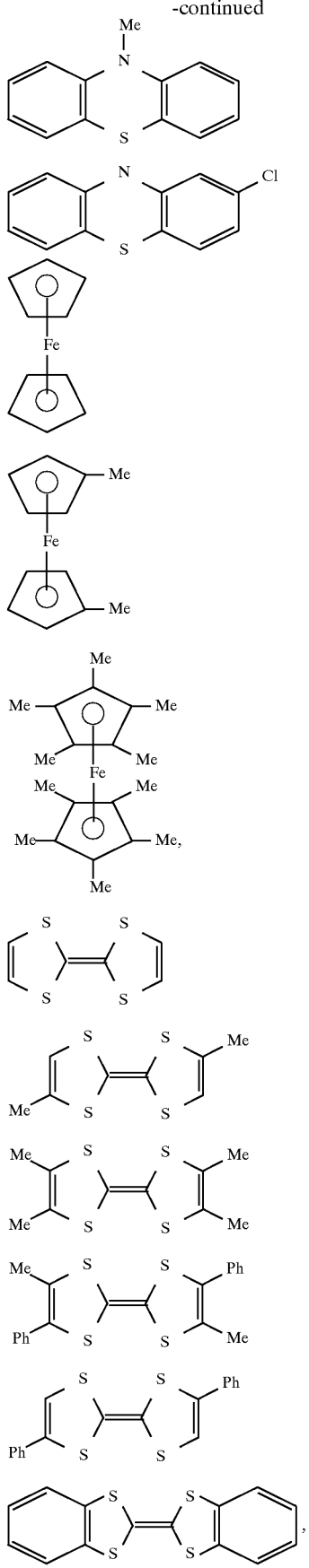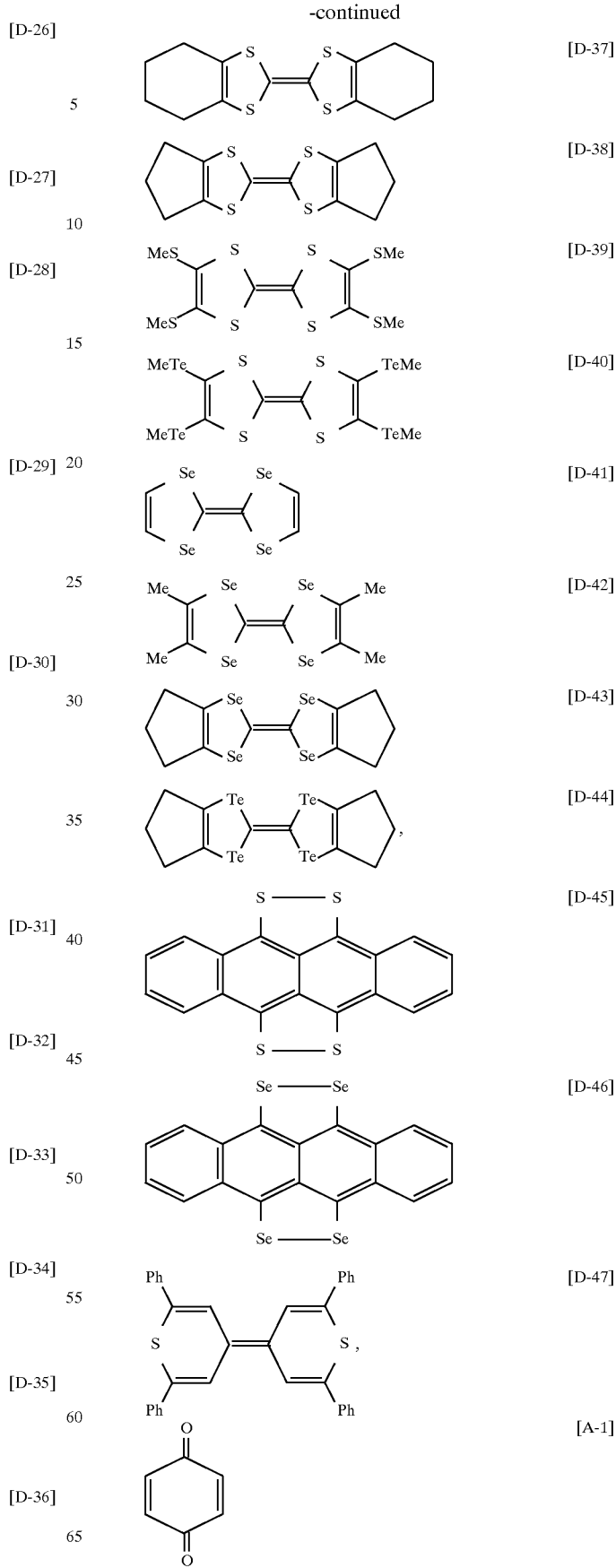

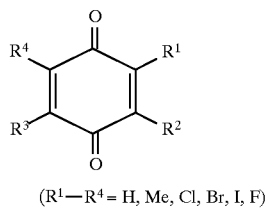
($R^1$—$R^4$ = H, Me, Cl, Br, I, F)
[A-2]
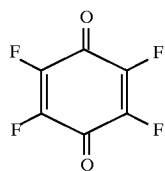
[A-10]
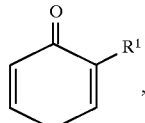
($R^1$ = Me, Cl, Br)
[A-3]
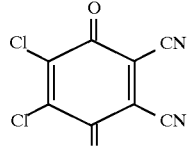
[A-11]
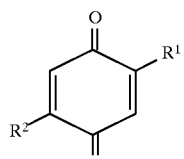
($R^1$, $R^2$ = Me, Cl, Br)
[A-4]
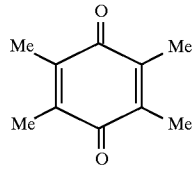
[A-12]
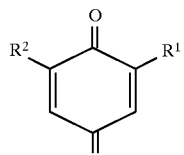
($R^1$, $R^2$ = Me, Cl, Br)
[A-5]
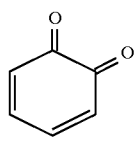
[A-13]
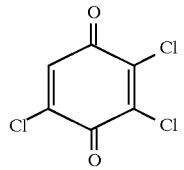
[A-6]
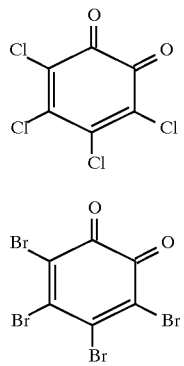
[A-14]
[A-15]
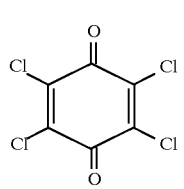
[A-7]
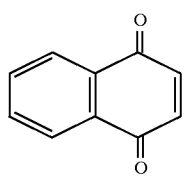
[A-16]
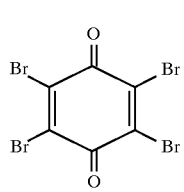
[A-8]
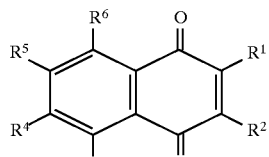
[A-17]
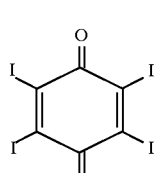
[A-9]
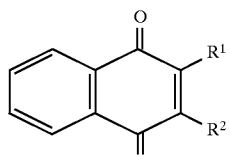
($R^1$, $R^2$ = Cl, CN)
[A-18]

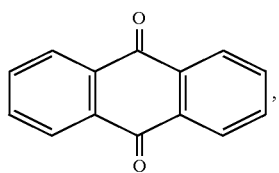
[A-19]
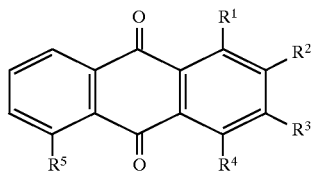
[A-20]
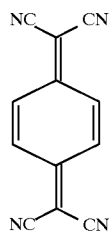
[A-21]
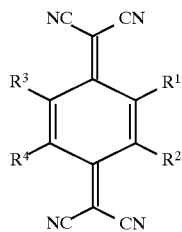
[A-22]
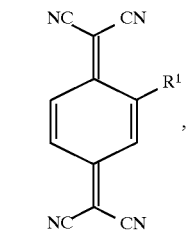
[A-23]
(R¹ = Me, OMe, F, Cl, Br)
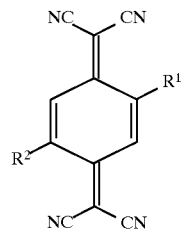
[A-24]
($R^1$, $R^2$ = Me, Et, Pr, OMe, F, Cl, Br, I)
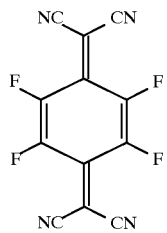
[A-25]
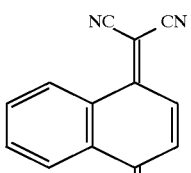
[A-26]
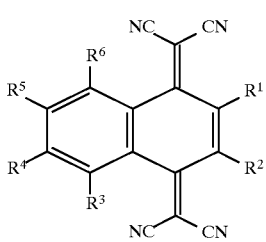
[A-27]
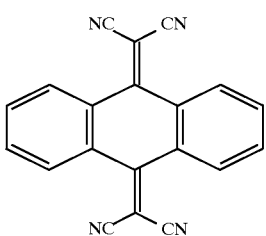
[A-28]
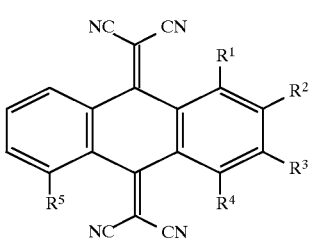
[A-29]
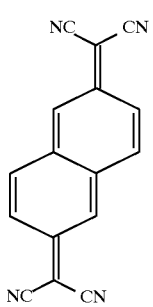
[A-30]
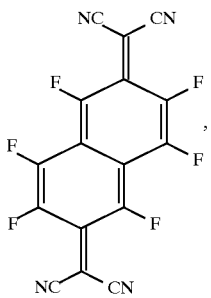
[A-31]

-continued
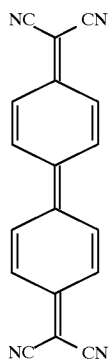 [A-32]
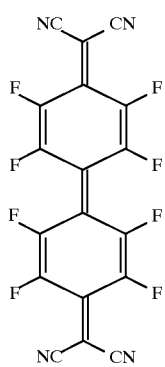 [A-33]
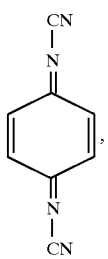 [A-34]
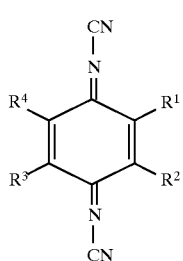 [A-35]
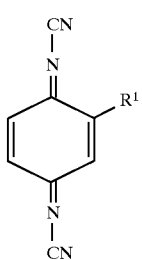 [A-36]
($R^1$ = Me, Cl, Br)
-continued
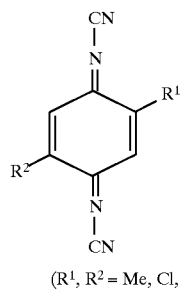 [A-37]
($R^1$, $R^2$ = Me, Cl, Br)
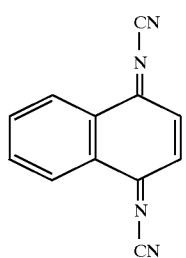 [A-38]
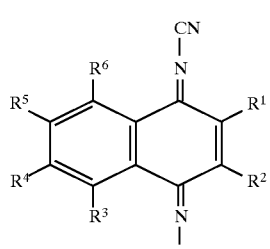 [A-39]
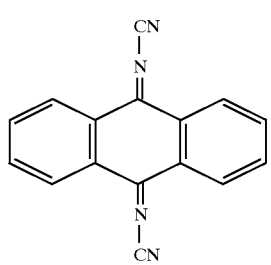 [A-40]
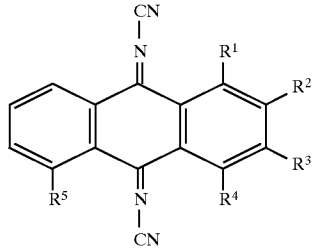 [A-41]
[A-42]
[A-43]

-continued

[A-44]
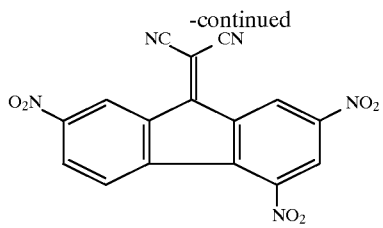

[A-45]
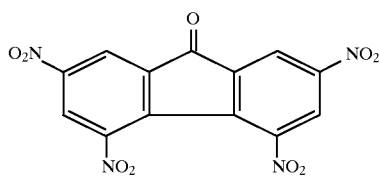

[A-46]
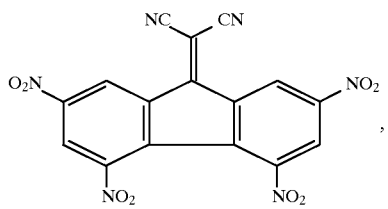

[A-47]

[A-48]
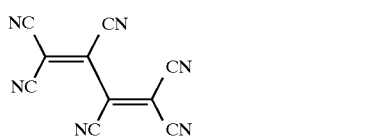

[A-49]
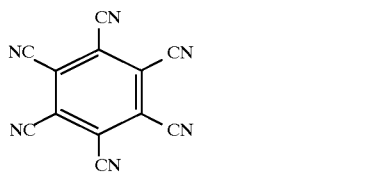

[A-50]
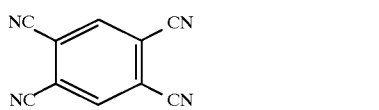

[A-51]

[A-52]
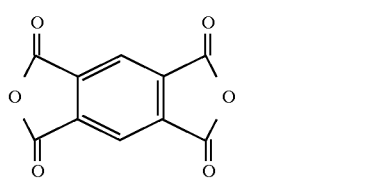

TABLE 1

| Donor | Acceptor |
|---|---|
| PD | TCNQ |
|  | $R^1$TCNQ |

TABLE 1-continued

| Donor | Acceptor |
|---|---|
| ClMePD | ($R^1$ = Me, F, Cl, Br) |
| DMePD | $R^1R^2$TCNQ |
| N,N-DMePD | ($R^1$, $R^2$ = Me, F, Cl, Br, I) |
| TMPD | $F_4$TCNQ |
| DAD | TNAP |
|  | TCNDQ |
|  | $F_2$TCNQ |
|  | $Cl_2$TCNQ |
| DClPD | $Br_2$TCNQ |
|  | $I_2$TCNQ |
|  | $F_4$TCNQ |
| PD | FA |
| DMePD | CA |
| N,N-DMePD | BA |
| TMPD | IA |
| DAD | DDQ |
|  | $(CN)_2$NQ |
| ClMePD | DDQ |
| DClPD |  |
|  | DCNQI |
|  | $R^1$DCNQI |
| PD | ($R^1$ = Me, Cl, Br) |
| DMePD | $R^1R^2$DCNQI |
| N,N-DMPD | ($R^1$, $R^2$ = Me, Cl, Br) |
| TMPD | $Cl_4$DCNQI |
| DAD | $F_4$DCNQI |
|  | DTF |
|  | DTENF |
|  | DCNQI |
|  | $R^1$DCNQI |
|  | ($R^1$ = Me, Cl, Br) |
|  | ClMeDCNQI |
| ClMePD | BrMeDCNQI |
|  | DClDCNQI |
|  | $Br_2$DCNQI |
|  | $Cl_4$DCNQI |
|  | $F_4$DCNQI |
|  | DClDCNQI |
| DClPD | $Br_2$DCNQI |
|  | $Cl_4$DCNQI |
|  | $F_4$DCNQI |
|  | FTCNQ |
|  | $F_2$TCNQ |
|  | $F_4$TCNQ |
|  | ClMeTCNQ |
|  | $Cl_2$TCNQ |
|  | BrMeTCNQ |
|  | $Br_2$TCNQ |
| TMB | IMeTCNQ |
| DAP | $I_2$TCNQ |
| TMDAP | $F_4$DCNQI |
|  | ClMeDCNQI |
|  | DClDCNQI |
|  | $Cl_4$DCNQI |
|  | BrMeDCNQI |
|  | $Br_2$DCNQI |
|  | DDQ |
|  | TCNQ |
|  | $R^1$TCNQ |
|  | ($R^1$ = Me, F, Cl, Br) |
|  | $R^1R^2$TCNQ |
|  | ($R^11$ $R^2$= Me, F, Cl, Br, I) |
|  | $F_4$TCNQ |
|  | DCNQI |
|  | $R^1$DCNQI |
| $M_2$P | ($R^1$ = Me, Cl, Br) |
| $E_2$P | $R^1R^2$DCNQI |
| $Pr_2$P | ($R^11$ $R^2$ = Me, Cl, Br) |
| HMP | $Cl_4$DCNQI |
| M6P | $F_4$DCNQI |
|  | FA |
|  | CA |
|  | BA |
|  | IA |
|  | DDQ |
|  | DTF |
|  | DTENF |

TABLE 1-continued

| Donor | Acceptor |
|---|---|
| | TNAP |
| | TCNDQ |
| PTZ | |
| N-MePTZ | DDQ |
| ClPTZ | |
| | BA |
| | DDQ |
| | $R^1R^2$DCNQI |
| TTF | ($R^1$ = Me, Cl, Br |
| | $R^2$ = Cl, Br) |
| | $Cl_4$DCNQI |
| | $F_4$DCNQI |
| | DDQ |
| | $R^1R^2$DCNQI |
| DMTTF | ($R^1$ = Me, Cl, Br |
| | $R^2$ = Cl, Br) |
| | $Cl_4$DCNQI |
| | $F_4$DCNQI |
| | FTCNQ |
| | $F_2$TCNQ |
| | $F_4$TCNQ |
| | ClMeTCNQ |
| | $Cl_2$TCNQ |
| | BrMeTCNQ |
| DBTTF | $Br_2$TCNQ |
| OMTTF | IMeTCNQ |
| | $I_2$TCNQ |
| | TNAP |
| | DClDCNQI |
| | $Br_2$DCNQI |
| | $Cl_4$DCNQI |
| | $F_4$DCNQI |
| | TCNQ |
| TTeClTTF | $R^1R^2R^3R^4$TCNQ |
| | ($R^1$ – $R^4$ = H, Cl, Br, I, F) |
| ferrocene | DDQ |
| decamethyl- | TCNQ |
| ferrocene | |
| | CA |
| cobaltocene | DDQ |
| | TNB |

TABLE 2

| Donor | Acceptor |
|---|---|
| | $Cl_3$BQ |
| | $Cl_2$BQ |
| | ClMeBQ |
| | $Br_2$BQ |
| | BrMeBQ |
| TMPD | ClBQ |
| N,N-DMePD | BrBQ |
| PD | $Me_4$BQ |
| DMePD | $Me_2$BQ |
| DAD | $Cl_2$BQ |
| | TNF |
| | TENF |
| | TCNB |
| | DCNB |
| | TNB |
| | CA |
| | FA |
| | BA |
| | IA |
| | $Cl_3$BQ |
| ClMePD | $Cl_2$BQ |
| DClPD | ClMeBQ |
| ClPD | $Br_2$BQ |
| TMB | BrMeBQ |
| NNN'N'-TMB | ClBQ |
| DAP | BrBQ |
| TMDAP | $Me_4$BQ |
| benzidine | $Me_2$BQ |

TABLE 2-continued

| Donor | Acceptor |
|---|---|
| | TNF |
| | TENF |
| | TCNB |
| | DCNB |
| | TNB |
| | $Cl_3$BQ |
| | $Cl_2$BQ |
| | ClMeBQ |
| | $Br_2$BQ |
| | BrMeBQ |
| $M_2$P | ClBQ |
| $E_2$P | BrBQ |
| $Pr_2$P | $Me_2$BQ |
| HMP | $Me_4$BQ |
| | TNF |
| | TENF |
| | TCNB |
| | DCNB |
| | TNB |
| | TCNQ |
| | MeTCNQ |
| | $Me_2$TCNQ |
| PTZ | $R^1R^2R^3R^4$BQ |
| N-MePTZ | ($R^1$ – $R^4$ = Me, Cl, Br, I, F) |
| ClPTZ | TCNE |
| phenazine | TNF |
| | TENF |
| | TCNB |
| | DCNB |
| | TNB |
| | TCNQ |
| | MeTCNQ |
| | $Me_2$TCNQ |
| benzidine | (OMe)TCNQ |
| TMB | $Et_2$TCNQ |
| NNN'N'-TMB | $Pr_2$TCNQ |
| | $(OMe)_2$TCNQ |
| | DMeDCNQI |
| | $R^1R^2R^3R^4$BQ |
| | ($R^1$ – $R^4$ = H, Me, Cl, Br, I, F) |
| | DMeDCNQI |
| | $R^1$BQ |
| | ($R^1$ = Me, Cl, Br) |
| TTF | $R^1R^2$BQ |
| | ($R^1$, $R^2$ = Me, Cl, Br) |
| | IA |
| | FA |
| | $Me_4$BQ |
| DMTTF | $R^1R^2R^3R^4$BQ |
| DPhTTF | ($R^1$ – $R^4$ = H, Me, Cl, Br, I, F) |
| | DMeDCNQI |
| DPhTTF | TCNQ |
| | TCNQ |
| | MeTCNQ |
| DBTTF | $Me_2$TCNQ |
| OMTTF | DMeDCNQI |
| | $R^1R^2R^3R^4$BQ |
| | ($R^1$ – $R^4$ = H, Me, Cl, Br, I, F) |
| | TCNQ |
| ferrocene | $R^1R^2R^3R^4$BQ |
| | ($R^1$ – $R^4$ = H, Me, Cl, Br, I, |
| | TCNB |
| | $R^1R^2R^3R^4$TCNQ |
| naphthlene | $R^1R^2R^3R^4$BQ |
| anthracene | $R^1R^2R^3R^4$DCNQI |
| phenanthrene | $R^1R^2R^3R^4R^5R^6$TCNNQ |
| pentacene | $R^1R^2R^3R^4R^5R^6$NQ |
| pyrene | $R^1R^2R^3R^4R^5R^6$DCNNQI |
| penylene | $R^1R^2R^3R^4R^5$TCNAQ |
| azulene | $R^1R^2R^3R^4R^5$AQ |
| acenaphthene | $R^1R^2R^3R^4R^5$DCNAQI |
| carbazole | TCNB |
| acridine | DCNB |
| | PMDA |
| | TNB |

Then, a criterion for selecting donor and acceptor molecules used preferably in the present invention is described. It is important for application to a device that the NI transition of the organic thin film can easily be induced by an electric field or light. In view of this, the difference I–E between average I (ionization potential of donor) and average E (electron affinity of acceptor) constituting the organic thin film is preferably slightly larger than Madelung energy $|E_M|$. Specifically, the difference between I–E and $|E_M|$ is 0.5 eV or less, preferably 0.1 eV or less. The averages I and E are weighted averages in terms of molar fraction, and these values are expressed respectively by the following equations:

$$I = x_i I_i + \ldots + x_n I_n$$

$$E = y_j E_j + \ldots + y_m E_m$$

The DA complexes satisfying above condition may be those cause neither pressure-induced NI transition nor temperature-induced NI transition. However, the complexes cause pressure-induced NI transition are preferable, and the complexes cause temperature-induced NI transition are more preferable. Such DA complexes are neutral at room temperature and they undergo temperature-induced NI transition at extremely low temperature. DA complexes that cause NI transition at higher temperature have a smaller difference between I–E and $|E_M|$ to facilitate NI transition by an electric field or light.

The present inventors focused their attention on donor and acceptor constituting DA complexes represent temperature-induced NI transition. And then, it was found that, by changing substituent group, and a suitable combination of donor and acceptor forming the ionic complex crystal at room temperature can be easily selected.

Figure 2B:
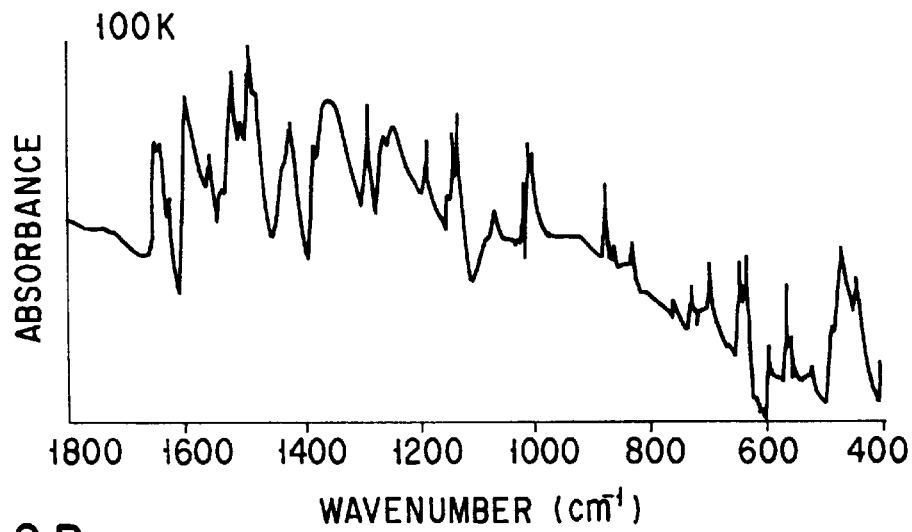

For example, a complex consisting of 2-chloro-5-methyl-p-phenylenediamine (ClMePD) and 2,5-dimethyldicyanoquinonediimine (DMeDCNQI) represents temperature-induced NI transition. Ultraviolet-visible absorption spectra of this complex crystal analyzed at 300° K and 100° K are shown in FIGS. 1A and 1B. Infrared absorption spectra of this complex crystal analyzed at 300° K and 100° K are shown in and FIGS. 2A and 2B. As can be seen from these spectra, the ClMePD-DMeDCNQI complex crystal shows a significantly different spectrum depending on temperature. This complex crystal is neutral at 300° K and ionic at 100° K, and temperature-induced NI transition occurs between 100° K and 300° K. This complex crystal can be assumed to have I–E–$|E_M|$<<0.1 eV.

Then, the present inventors examined the complex crystal consisting of a donor molecule similar to ClMePD but having a substituent group different from that of ClMePD and an acceptor molecule similar to DMeDCNQI but having a substituent group different from that of DMeDCNQI. Here, the substituent groups in question are a chlorine atom and a methyl group. These molecules are shown below.

Judging from the degree of charge-transfer, the properties of various species of complex crystal consisting of a combination of donor and acceptor molecules are as follows:

Neutral:

ClMePD-DMeDCNQI

DClPD-ClMeDCNQI

This DClPD-ClMeDCNQI, similar to ClMePD-DMeDCNQI, represented temperature-induced NI transition.

Ionic:

ClMePD-ClMeDCNQI

DMePD-DMeDCNQI

DClPD-DClDCNQI

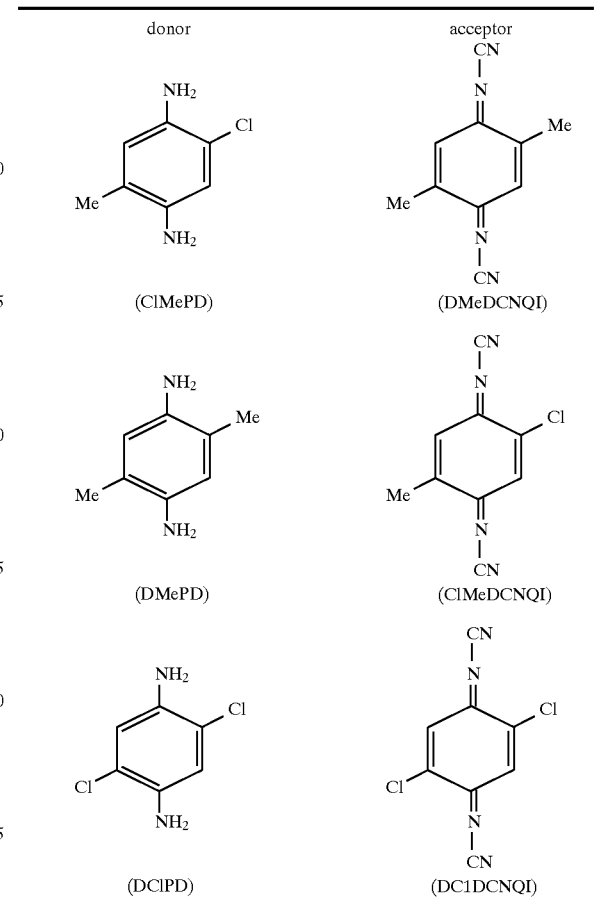

Three species of donor are similar to each other in molecular structure, but differ in electron structure. Also, three species of acceptor are similar to each other in molecular structure, but different in electron structure. The similarity among their molecular structures suggests that the crystalline structures of the complexes are also similar to each other even if any of the donor and acceptor molecules are combined.

To retain similarity for molecular structure, the substituent group preferably possesses a similar van der Waals radius R to that of the corresponding substituent group to be replaced. In the above examples, van der Waals radiuses are 0.18 nm for Cl and 0.2 nm for methyl group. In the present invention, the van der Waals radius of the substituent group is preferably in the range of 0.8 to 1.2 relative to the corresponding substituent group to be replaced.

The substituent group satisfying this condition to substitute for a methyl group includes a bromine atom (R=0.195 nm) and an iodine atom (R=0.215 nm) in addition to the aforesaid chlorine atom. An example substituting for a hydrogen atom (R=0.12 nm) is a fluorine atom (R=0.135 nm).

The following is the qualitative effect of the substituent group on the electronic state of donor or acceptor molecule. For example, halogen such as chlorine weakens the donor property by increasing the I value when introduced to D molecule while it strengthens the acceptor property by increasing the E value when introduced to A molecule. On the other hand, an alkyl group such as methyl group strengthens the donor property by decreasing the I value when introduced into D molecule while weakens the acceptor property by decreasing the E value when introduced into A molecule.

It is understood that whether the complex crystal becomes neutral or ionic depending on a combination of donor and acceptor molecules is atrituted to difference of the substituent group introduced into those molecules.

Another substituent group with a similar tendency to halogen is a cyano group. Other substituent groups with a similar tendency to an alkyl group are an alkenyl group, alkynyl group, aryl group, alkoxyl group, and amino group. Among these substituent groups, D and A molecules in which halogen, alkyl group, alkenyl group, alkynyl group, alkoxyl group, alkylthio group, each having three or less carbon atoms, or cyano group is introduced are relatively easily synthesized. Hence, these substituent groups are useful for controlling the I value of D molecule as well as the E value of A molecule.

The above-described criterion for selecting suitable donor and acceptor molecules in the present invention can also be applied to other donor and acceptor molecules with similar molecular skeletons. In the examples described above, complexes consisting of a donor molecule having a p-phenylenediamine skeleton and an acceptor molecule having a dicyanoquinonediimine skeleton are described. For the acceptor molecule, molecular skeletons similar to the dicyanoquinonediimine skeleton include tetracyanoquinodimethane skeleton and benzoquinone skeleton.

TMB-TCNQ complex contains an acceptor having tetracyanoquinodimethane skeleton. It is know that TMB-TCNQ complex crystal is neutral at room temperature and cause temperature-induced NI transition at about 205° K. With respect to TMB-TCNQ complex, by introducing a specific substituent group into acceptor molecule, we can find out a combination of donor and acceptor molecules forming an ionic complex crystal. For example, TMB-FTCNQ, TMB-$F_2$TCNQ or TMB-$F_4$TCNQ forms an ionic complex crystal at room temperature. Therefore, a mixed-stacked charge-transfer complex forming a mixed crystal can be formed easily by using a combinations of donor and acceptor molecules consisting of a group forming ionic complex crystal and a group forming neutral complex crystal.

Examples of a mixed-stacked charge-transfer complex forming a mixed crystal that contains an acceptor molecule having benzoquinone skeleton are a complex consisting of a combination of $M_2$P-BQ forming neutral complex crystal and $M_2$P-FA forming ionic complex crystal, and a complex consisting of a combination of TMPD-BQ forming neutral complex crystal and TMPD-FA forming ionic complex crystal.

The method of forming the organic thin film of the present invention includes vacuum deposition, molecular beam epitaxy, and spin coating. If the vacuum deposition or molecular beam epitaxy is used for forming the organic thin film, it is possible to employ plural vapor sources for the donor and acceptor or complex for forming the mixed crystal. It is also possible to employ a mixed crystal, formed by co-sublimation, crystallization by cooling gradually a solution, diffusion method, or electrolysis, as vapor source. In the case of forming the organic thin film by spin coating, a solution containing the donor and acceptor for forming the mixed crystal is used.

The organic thin film device of the present invention, which contains the organic thin film described above, includes, for example, a display device, a field effect transistor and an optical recording device. The organic thin film according to the present invention can be incorporated in various manners into these devices.

For example, a plurality of organic thin films forming mixed crystal may be laminated with interposing other organic thin films (e.g. insulating films) therebetween. The plurality of organic thin films may consist of two or more mixed crystals.

In a display device, an insulating layer and an electrode are provided on both surfaces of an organic thin film forming mixed crystal.

In a field effect transistor, there are provided a silicon substrate, a source and drain regions formed in the silicon substrate, a gate insulating film formed on a channel region between the source and drain regions, an organic thin film layer containing an organic thin film forming mixed crystal formed on the gate insulating film, and a gate electrode formed on the organic thin film layer.

Further, in an optical recording device, there is formed a recording unit having a three-layered structure of an organic thin film consisting of donor molecule and an organic thin film consisting of acceptor molecule formed on both surfaces of an organic thin film forming mixed crystal. In this case, if plural recording units, each having the three-layered structure, consisting of different combinations of donor molecule, complex mixed crystal, and acceptor molecule are formed, the device can be used for multiple optical recording.

EXAMPLES

The present invention is described in more detail by reference to the following examples.

Example 1

An organic thin film consisting of a mixed crystal (ClMePD)$_{x1}$(DMePD)$_{x2}$-DMeDCNQI containing two species of donor, i.e., 2-chloro-5-methyl-p-phenylenediamine (ClMePD) and 2,5-dimethyl-p-phenylenediamine (DMePD) and one species of acceptor, i.e., 2,5-dimethyldicyanoquinonediimine (DMeDCNQI) is prepared on a Si substrate or a quartz glass substrate in two methods (a) and (b) as described below. At room temperature, ClMePD-DMeDCNQI forms neutral complex crystal, while DMePD-DMeDCNQI forms ionic complex crystal.

(a) ClMePD-DMeDCNQI crystal powder and DMePD crystal powder are placed respectively in separate crucibles. Each crucible is heated under a vacuum of $1 \times 10^{-5}$ Torr, thereby depositing a mixed crystal on a substrate cooled at about 240° K. At this time, the flux ratio between ClMePD-DMeDCNQI and DMePD is varied by controlling the temperatures of the two crucibles, so that various (ClMePD)$_{x1}$(DMePD)$_{x2}$-DMeDCNQI mixed crystal thin films different each other in the molar ratio of the donor molecules are formed.

(b) A heated solution of ClMePD and DMePD in toluene and a heated solution of DMeDCNQI in toluene are mixed in a nitrogen atmosphere and cooled gradually to yield the mixed crystal (ClMePD)$_{x1}$(DMePD)$_{x2}$-DMeDCNQI. At this time, the molar fractions $x_1$ and $x_2$ are varied by changing the concentrations of ClMePD and DMePD in toluene. The resulting mixed crystal powder is placed in a crucible and heated under a vacuum of $1 \times 10^{-5}$ Torr, thereby depositing the mixed crystal on a substrate cooled at about 240° K. Various (ClMePD)$_{x1}$(DMePD)$_{x2}$-DMeDCNQI mixed crystal thin films different each other in the molar ratio of the donor molecules are prepared depending on the mixed crystal powder used.

The molar ratio between ClMePD and DMePD in the resulting mixed crystal thin film is determined by analyzing an ultraviolet-visible spectrum of a solution of the thin film in toluene.

From an infrared absorption spectrum and X-ray diffraction pattern of the resulting mixed thin film, it is found that in both methods (a) and (b), a mixed-stacked charge-transfer complex is formed with the molar fraction $x_2$ of DMePD in the range of $0<x_2<1$. From its degree of ionization at room temperature estimated from the infrared absorption spectrum, the CT complex is found neutral when $x_2<0.3$ and ionic when $x_2>0.3$. The thin film formed on the glass substrate is found to turn from yellowish brown to reddish brown with increasing $x_2$.

Example 2

An organic thin film consisting of the mixed crystal ClMePD-(DMeDCNQI)$_{y1}$(ClMeDCNQI)$_{y2}$ containing one species of donor, i.e., 2-chloro-5-methyl-p-phenylenediamine (ClMePD) and two species of acceptor, i.e., 2,5-dimethyldicyanoquinonediimine (DMeDCNQI) and 2-chloro-5-dimethyldicyanoquinonediimine (ClMeDCNQI) is prepared on a Si substrate or a glass substrate in the following manner. At room temperature, ClMePD-DMeDCNQI forms neutral complex crystal, while ClMePD-ClMeDCNQI forms ionic complex crystal.

A heated solution of ClMePD in acetonitrile and a heated solution of DMeDCNQI and ClMeDCNQI in acetonitrile are mixed in a nitrogen atmosphere and cooled gradually to yield the mixed crystal ClMePD-(DMeDCNQI)$_{y1}$(ClMeDCNQI)$_{y2}$. At this time, the molar fractions $y_1$ and $y_2$ of the acceptor molecules are varied by changing the DMeDCNQI or ClMeDCNQI concentration in acetonitrile. The mixed crystal powder is placed in a crucible and heated under a vacuum of $1\times10^{-5}$ Torr and the mixed crystal is deposited on a substrate cooled at about 240° K. Various species of ClMePD-(DMeDCNQI)$_{y1}$(ClMeDCNQI)$_{y2}$ mixed crystal thin film with different molar ratios of the acceptor molecules are prepared depending on the type of mixed crystal powder.

From an infrared absorption spectrum and X-ray diffraction pattern of the resulting mixed thin film, it is found that a mixed-stacked CT complex is formed with the molar fraction $y_2$ of ClMeDCNQI in the range of $0<y_2<1$. From its degree of ionization at room temperature estimated from the infrared absorption spectrum, the CT complex is found neutral when $y_2<0.3$ and ionic when $y_2>0.3$. The thin film formed on the glass substrate is found to turn from yellowish brown to red with increasing $y_2$.

Example 3

An organic thin film consisting of the mixed crystal PTZ-(TCNQ)$_{y1}$(F$_4$TCNQ)$_{y2}$ containing one species of donor, i.e., phenothiazine (PTZ) and two species of acceptor, i.e., TCNQ and tetrafluoro-TCNQ (F$_4$TCNQ) is prepared on a Si substrate or a glass substrate. PTZ-TCNQ forms neutral complex crystal at room temperature. A combination of PTZ and F$_4$TCNQ does not form crystal, but I (ionization potential) of PTZ is 6.8 eV and E (electron affinity) of F$_4$TCNQ is 3.3 eV, so that the relationship I−E<4.1 eV is satisfied.

In this example, a mixed crystal film is prepared using two separate vapor sources of PTZ-TCNQ and F$_4$TCNQ in the same manner as in Example 1 (a). Various species of PTZ-(TCNQ)$_{y1}$(F$_4$TCNQ)y$_2$ mixed crystal thin film with different molar ratio between TCNQ and F$_4$TCNQ are prepared by changing the flux ratio of the two vapor sources.

From an infrared absorption spectrum and X-ray diffraction pattern of the resulting mixed thin film, it is found that a mixed-stacked CT complex is formed with the molar fraction $y_2$ of F$_4$TCNQ in the range of $0<y_2<0.5$. From its degree of ionization at room temperature estimated from the infrared absorption spectrum, the complex is found neutral when $y_2<0.3$ and ionic when $0.3<y_2<0.5$. The thin film formed on the glass substrate is found to turn from reddish brown to dark purple with increasing $y_2$.

Example 4

An organic thin film consisting of the mixed crystal TTF-(BQ)$_{y1}$(BA)$_{y2}$ containing one species of donor, i.e., tetrathiafulvalene (TTF) and two species of acceptor, i.e., benzoquinone (BQ) and bromanil (BA) is prepared on a Si substrate or a glass substrate. TTF-BA forms ionic complex crystal at room temperature. A combination of TTF and BQ does not form crystal, but I (ionization potential) of TTF is 6.4 eV and E (electron affinity) of BQ is 1.9 eV, so that the relationship I−E>4.1 eV is satisfied.

In this example, three separate vapor sources of TTF, BQ, and BA are used to form a mixed crystal film on a substrate cooled at about 100° K under a vacuum of $1\times10^{-5}$ Torr. Various species of TTF-(BQ)$_{y1}$(BA)$_{y2}$ mixed crystal thin film with different molar ratio between BQ and BA are prepared by changing the flux ratio of the three vapor sources.

From an infrared absorption spectrum and X-ray diffraction pattern of the resulting mixed thin film, it is found that a mixed stacked CT complex is formed with the molar fraction $y_2$ of BA in the range of $0.5<y_2<1$. From its degree of ionization at room temperature estimated from the infrared absorption spectrum, the CT complex is found neutral when $y_2<0.7$ and ionic when $y_2>0.7$. The thin film formed on the glass substrate is found to turn from yellowish brown to black with increasing $y_2$.

Example 5

An organic thin film consisting of the mixed crystal DClPD-(ClMeDCNQI)$_{y1}$(DClDCNQI)$_{y2}$ containing one species of donor, i.e., 2,5-dichloro-p-phenylenediamine (DClPD) and two species of acceptor, i.e., 2-chloro-5-methyldicyanoquinonediimine (ClMeDCNQI) and 2,5-dichlorodicyanoquinonediimine (DClDCNQI) is prepared on a Si substrate or a glass substrate. At room temperature, DClPD-ClMeDCNQI forms neutral complex crystal, while DClPD-DClDCNQI forms ionic complex crystal.

In this example, three separate vapor sources of DClPD, ClMeDCNQI, and DClDCNQI are used to form a mixed crystal film on a substrate cooled at about 240° K under a vacuum of $1\times10^{-5}$ Torr. Various species of DClPD-(ClMeDCNQI)$_{y1}$(DClDCNQI)$_{y2}$ mixed crystal thin film with different molar ratio between ClMeDCNQI and DClDCNQI are prepared by changing the flux ratio of the three vapor sources.

From an infrared absorption spectrum and X-ray diffraction pattern of the resulting mixed thin film, it is found that a mixed stacked CT complex is formed with the molar fraction $y_2$ of DClDCNQI in the range of $0<y_2<1$. From its degree of ionization at room temperature estimated from the infrared absorption spectrum, the CT complex is found neutral when $y_2<0.2$ and ionic when $y_2>0.2$. The thin film formed on the glass substrate is found to turn from yellowish brown to dark reddish black with increasing $y_2$.

Example 6

An organic thin film consisting of the mixed crystal (DClPD)$_{x1}$(ClMePD)$_{x2}$-ClMeDCNQI is prepared on a graphite substrate.

In this example, the mixed crystal is grown by molecular beam epitaxy, using three kinds of molecular beam of DClPD, ClMePD and ClMeDCNQI, by alternately laminating a donor layer of DClPD and ClMePD with an acceptor layer of ClMeDCNQI on a substrate cooled at about 77° K under a vacuum of $1 \times 10^{-9}$ Torr. Then, various species of $(DClPD)_{x1}(ClMePD)_{x2}$-ClMeDCNQI mixed crystal thin film with different molar ratio of the donor molecules are formed by changing the flux ratio of the molecular beam.

The degree of ionization at room temperature of the mixed crystal estimated from an infrared absorption spectrum of the resulting mixed crystal thin film indicated that it is neutral when $x_2 < 0.3$ and ionic when $x_2 > 0.3$.

Example 7
(Display Device)

Figure 3:
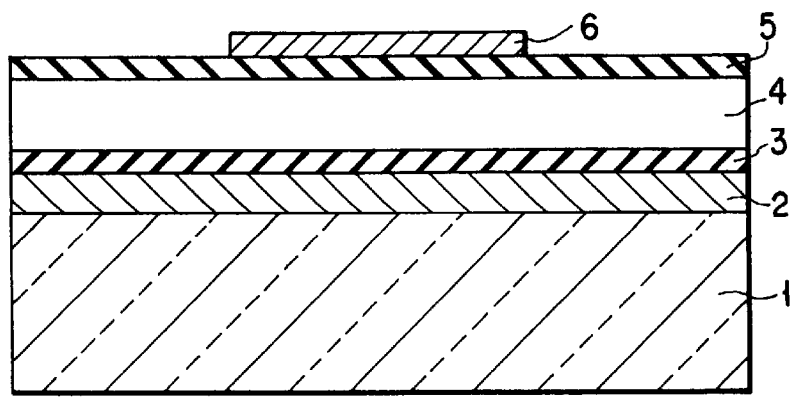
FIG. 3 shows a sectional view of the display device of the present invention.

FIG. 3 shows a sectional view of one embodiment of the display device according to the present invention. As shown in FIG. 3, the display device is made by forming, on a glass substrate 1, an ITO transparent electrode 2 with the thickness of 400 nm, a $SrTiO_3$ layer 3 with the thickness of 100 nm as a first insulating film, an organic thin film layer 4 consisting of TTF-$(Br_2BQ)_{y1}(BA)_{y2}$ mixed crystal with the thickness of 200 nm, a polyvinylidene fluoride (PVDF) film 5 with the thickness of 100 nm as a second insulating layer, and a transparent Au electrode 6 with the thickness of 20 nm.

The transparent electrode 2 and the first insulating layer 3 are formed on the glass substrate 1 by sputtering in order. The organic thin film layer 4 consisting of TTF-$(Br_2BQ)_{y1}(BA)_{y2}$ mixed crystal is prepared in the same manner as in Example 4. In this example, two devices are prepared by regulating the flux ratio such that $y_2 = 0.29$ (device 1) and $y_2 = 0.42$ (device 2). The second insulating layer 5 and the Au electrode 6 are formed in order by vacuum deposition.

In both display devices 1 and 2, the organic thin film layer 4 of TTF-$(Br_2BQ)_{y1}(BA)_{y2}$ is yellowish green when no voltage is applied between the two electrodes. If negative voltage is applied between the electrodes 2 and 6 with the electrode 2 grounded, then the organic thin film layer 4 clearly turns black at a voltage of about −30 V in the device 1 and at a voltage of about −10 V in the device 2.

For comparison, the same display device is prepared except that organic thin film layer 4 is made only TTF-$Br_2BQ$. In this device, no color change occurs in the organic thin film layer 4 even by application of a voltage of up to −100 V.

Example 8
(Display Device)

Figure 4:
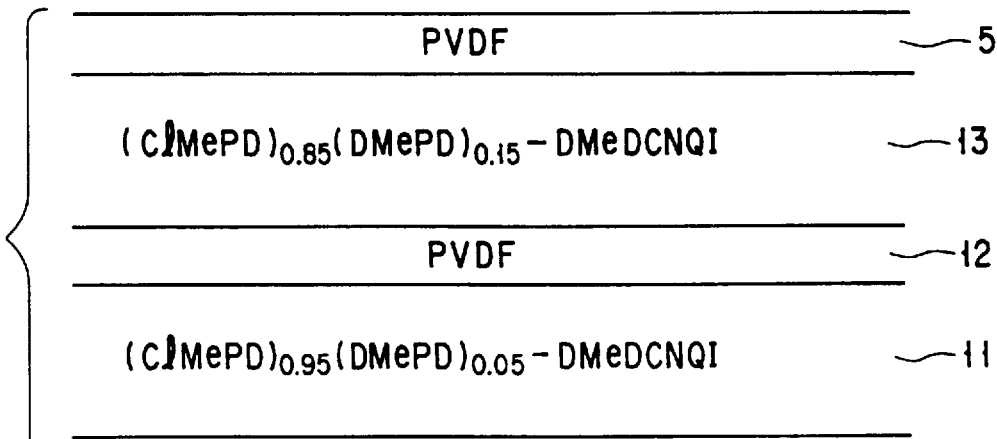
FIG. 4 is a drawing of the laminate structure of the organic thin film constituting the display device.

In this example, a multivalued (multicolor) display device is manufactured by forming the organic thin film layer 4 in FIG. 3 into a multi-layer structure as shown in FIG. 4. This organic thin layer 4 has a structure having $(ClMePD)_{0.95}(DMePD)_{0.05}$-DMeDCNQI mixed crystal thin film 11 with the thickness of 100 nm, a PVDF film 12 with the thickness of 20 nm, and a $(ClMePD)_{0.85}(DMePD)_{0.15}$-DMeDCNQI mixed crystal thin film 13 with the thickness of 100 nm laminated in order. This organic thin film layer is provided with PVDF film with the thickness of 50 nm as a second insulating layer 5.

This display device shows the following colors depending on the applied voltage $|V|$.

Yellowish brown for $|V| < 5$ V.

Reddish brown for $5 < |V| < 8$ V.

Dark reddish black for $|V| > 8$ V.

Example 9
(Display Device)

Figure 5:
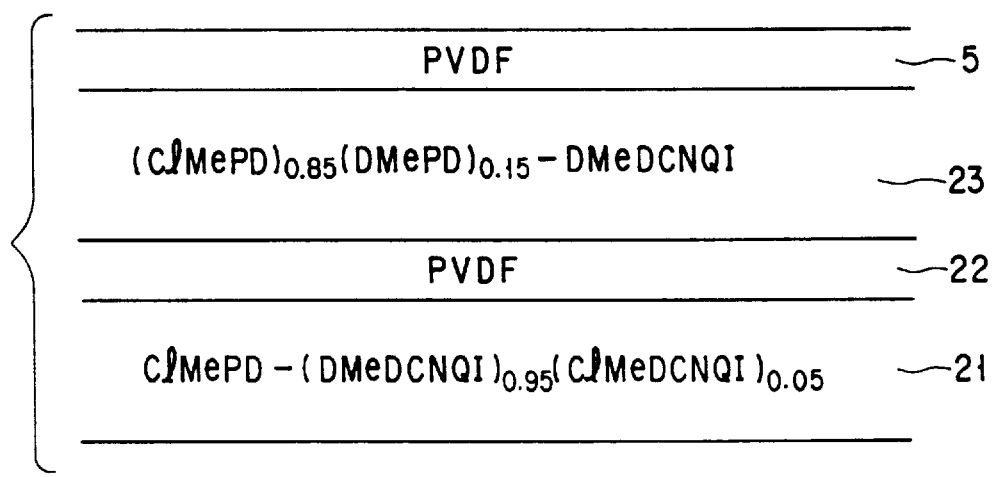
FIG. 5 is a drawing of the laminate structure of the organic thin film constituting the display device.

In this example, a multivalued (multicolor) display device is manufactured by forming the organic thin film layer 4 in FIG. 3 into a multi-layer structure as shown in FIG. 5. This organic thin layer 4 has a structure having ClMePD-$(DMeDCNQI)_{0.95}(ClMeDCNQI)_{0.05}$ mixed crystal thin film 21 with the thickness of 100 nm, PVDF film 22 with the thickness of 20 nm, and $(ClMePD)_{0.85}(DMePD)_{0.15}$-DMeDCNQI mixed crystal thin film 23 with the thickness of 100 nm laminated in order. This organic thin film layer is provided with PVDF film with the thickness of 50 nm as a second insulating layer 5.

This display device shows the following colors depending on the applied voltage $|V|$.

Yellowish brown for $|V| < 5$ V.

Reddish brown for $5 < |V| < 8$ V.

Dark red for $|V| > 8$ V.

Example 10
(FET)

Figure 6:
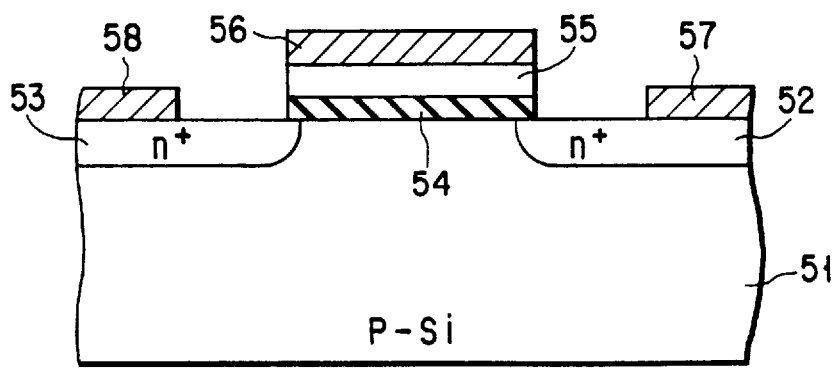
FIG. 6 is a sectional view of FET of the present invention.

In this example, the n-channel MOSFET shown in FIG. 6 is manufactured. In FIG. 6, an n-type source and drain regions 52 and 53 are formed on a p-type silicon substrate 51. A gate oxide film 54 consisting of a thermal oxide with the thickness of about 10 nm, an organic thin film layer 55 and a gate electrode 56 is formed on the channel between the source and drain regions 52 and 53. Source and drain electrodes 57 and 58 are formed on the source and the drain regions 52 and 53.

In this example, organic thin film layer 55 of FET in FIG. 6 is formed into a multi-layer structure as shown in FIG. 7. This organic thin film layer 55 has a structure having DClPD-ClMeDCNQI thin film 61 with the thickness of 10 nm, PVDF film 62 with the thickness of 5 nm, $(DClPD)_{0.85}(ClMePD)_{0.15}$-ClMeDCNQI mixed crystal thin film 63 with the thickness of 10 nm, and PVDF film 64 with the thickness of 5 nm laminated in order. Each layer is formed by vacuum deposition.

The source-drain current of this FET suddenly increases and the device shows the multi-stage switching when the gate voltage reaches 1.5 ($V_1$) and 2.1 V ($V_2$), as shown in FIG. 9.

Example 11
(FET)

In this example, the organic thin film 55 shown in FIG. 6 is formed into a multi-layer structure as shown in FIG. 8. This organic thin film layer 55 has a structure having ClMePD-DMeDCNQI thin film 71 with the thickness of 10 nm, PVDF film 72 with the thickness of 5 nm, $(DClPD)_{0.85}(ClMePD)_{0.15}$-ClMeDCNQI mixed crystal thin film 73 with the thickness of 10 nm, and PVDF film 74 with the thickness of 5 nm laminated in order. Each layer is formed by the vacuum deposition.

The source-drain current of this FET suddenly increases and the device shows the multi-stage switching when the gate voltage reaches 1.5 ($V_1$) and 1.8 V ($V_2$), as shown in FIG. 9.

Example 12
(Optical Recording Device)

Figure 10:
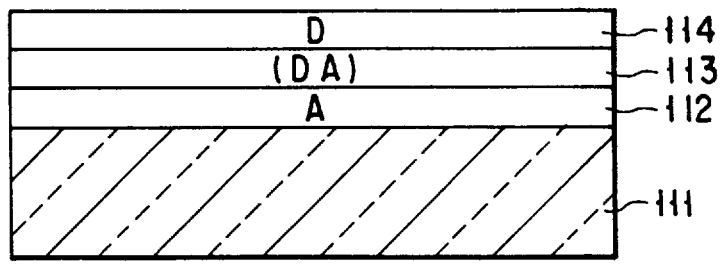
FIG. 10 is a sectional view of the optical recording device of the present invention.

FIG. 10 is a sectional view of the optical recording device of the present invention. As shown in FIG. 10, DMeDCNQI thin film with the thickness of 50 nm as A molecule thin film 112, $(ClMePD)_{0.85}(DMePD)_{0.15}$-DMeDCNQI mixed crystal thin film with the thickness of 100 nm as complex thin film 113, and a tetraazanulene-nickel complex thin film with the thickness of 20 nm as D molecule thin film 114 are laminated to form a three-layered structure on glass substrate 111.

Information is written in the optical recording device by applying a laser beam with the wavelength of 460 nm specifically absorbed by the tetraazannulene-nickel complex of the D molecule from an optical system under the conditions of the spot diameter of 5 nm and the output of 100 mW. In this case, the information is held because the D molecule is optically excited, electrons move to the A molecule thin film through the mixed crystal thin film, D and A molecules are ionized, and the complex mixed crystal is ionized by these polarized fields. For the ionic mixed crystal in the recording portion, absorption is observed at the wavelength of 560 nm. For the neutral mixed crystal in the nonrecording portion, however, no absorption is observed at the wavelength of 560 nm. The reference beam with the output of 0.2 mW adjusted so that the light intensity distribution will be present only at the wavelength between 500 to 600 nm by passing white light through a band filter, is applied to the recorded device. The intensity of the transmitted light at the wavelength of 500 nm is amplified and detected. And the intensities of the transmitted light from the recording portion and from the nonrecorded portion are compared. As a result, the intensity change of signal $\Delta Ts$ can be detected which is much larger than of noise level $\Delta Tn$.

Example 13
(Multiple Optical Recording device)

In this example, the recording and reading methods for the multiple optical recording device are described with reference to FIGS. 11 and 12.

Figure 11:
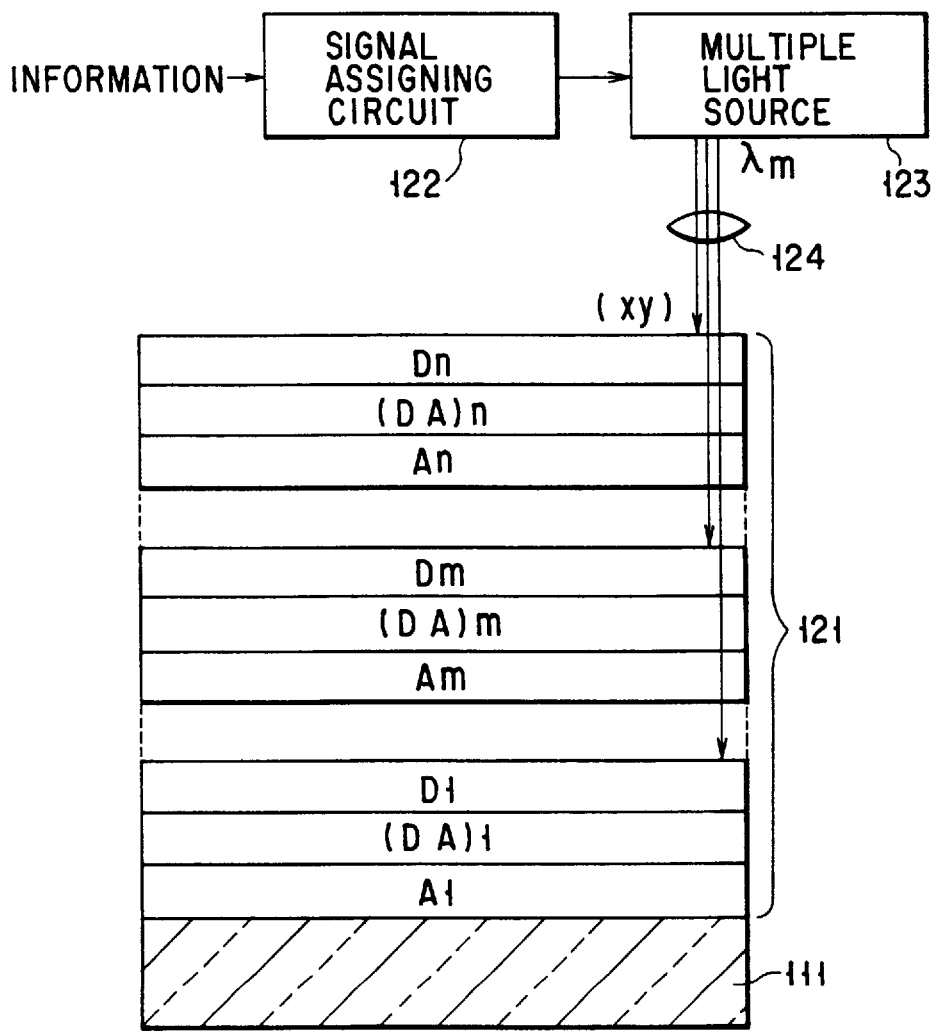
FIG. 11 is a schematic drawing for explaining a recording method for the optical recording device of the present invention.

As shown in FIG. 11, a multiple optical recording device 121 is formed by laminating recording units, each consisting of a three-layered structure of $D_m/[DA]_m/A_m$ where m is 1 to n (each recording unit has a different combination of component molecules) by n stages on a glass substrate 111. $D_m$ (m ranges from 1 to n) molecule constituting each recording unit specifically senses the light with wavelength of $\lambda_m$ (m ranges from 1 to n). Information is assigned to each light source for emitting the light with the wavelength of $\lambda_m$ (m ranges from 1 to n) constituting a multiple light source 123 by a signal assigning circuit 122 and on/off of each light source is controlled. The light corresponding to information is applied to the recording portion (xy) of the multiple optical recording device 121 through an optical system 124. At the recording portion (xy), D molecule of the recording unit sensing the applied light is excited, electrons move to A molecule through a neutral [DA] mixed crystal thin film, D and A molecules are ionized, and the complex mixed crystal is ionized by these polarized fields. Thus, information is recorded in the recording portion (xy) for each layer where each recording unit is formed.

As shown in FIG. 12, information is held in the recording unit where recorded under the condition of $[D^+A^-]_m$ (m ranges from 1 to n) which is realized as a result of transition of complexes from neutral to ionic state. Each ionic $[D^+A^-]_m$ complex mixed crystal has a light absorption $\lambda_m'$ (m ranges from 1 to n) at the long wavelength side than neutral [DA] complex crystal has. Reference beam with a wide wavelength range and a low output is emitted from a reference light source 125. The information in the recording unit can simultaneously be read in parallel by a scanning-type spectrophotometer 126 installed under the multiple optical recording device 121 and scanned by a scanning circuit 127. And it is possible to convert the information equivalent to the original information by signal processing circuit 128.

What is claimed is:

1. An organic thin film device having an organic thin film consisting essentially of a mixed-stacked charge-transfer complex, wherein the organic thin film contains n species of donor molecule $D_1 \ldots D_n$ and m species of acceptor molecule $A_1 \ldots A_m$ (n and m are integers satisfying n+m>2) and forms mixed crystal represented by the following formula:

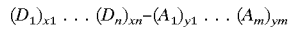

where $x_i$ (i=1 to n) is the molar fraction of donor molecule $D_i$; $y_j$ (j=1 to m) is the molar fraction of acceptor molecule $A_j$; $x_1+ \ldots +x_n=1$; and $y_1+ \ldots +y_m=1$, and wherein combinations of a donor molecule and an acceptor molecule consist of a group forming ionic complex crystal and a group forming neutral complex crystal.

2. An organic thin film device having) an organic thin film consisting essentially of a mixed-stacked charge-transfer complex, wherein the organic thin filn contains n species of donor molecule $D_1 \ldots D_n$ and m species of acceptor molecule $A_1 \ldots A_m$ (n and m are integers satisfying n+m>2) and forms mixed crystal represented by the following formula:

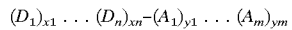

where $x_i$ (i=1 to n) is the molar fraction of donor molecule $D_i$; $y_j$ (j=1 to m) is the molar fraction of acceptor molecule $A_j$; $x_1+ \ldots +x_n=1$; and $y_1+ \ldots +y_m=1$, and wherein the combinations of a donor and an acceptor molecules consist of a group forming neutral complex crystal and a group forming an ionic complex crystal where the difference $I_i-E_j$ between the ionization potential $I_i$ of donor $D_i$ and the electron affinity $E_j$ of acceptor $A_j$ is 4.1 eV or less in said ionic complex crystal.

3. An organic thin film device having an organic thin film consisting essentially of a mixed-stacked charge-transfer complex, wherein the organic thin film contains n species of donor molecule $D_1 \ldots D_n$ and m species of acceptor molecule $A_1 \ldots A_m$ (n and m are integers satisfying n+m>2) and forms mixed crystal represented by the following formula:

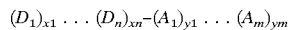

where $x_i$ (i=1 to n) is the molar fraction of donor molecule $D_i$; $y_j$ (j=1 to m) is the molar fraction of acceptor molecule $A_j$; $x_1+ \ldots +x_n=1$; and $y_1+ \ldots +y_m=1$, and wherein the combinations of a donor and an acceptor molecules consist of a group forming ionic complex crystal and a group forming a neutral complex crystal where the difference $I_i-E_j$ between the ionization potential $I_i$ of donor $D_i$ and the electron affinity $E_j$ of acceptor $A_j$ is 4.1 eV or more in said neutral complex crystal.

4. An organic thin film device having an organic thin film, wherein the organic thin film consists essentially of a mixed-stacked charge-transfer complex forming mixed crystal having donor and acceptor molecules, at least one of said donor molecule and acceptor molecule containing two or more species, and wherein combinations of a donor molecule and an acceptor molecule consist of a group forming ionic complex crystal at 85° K or more and a group forming neutral complex crystal at 85° K or more.

5. The organic thin film device according to claim 1, wherein both the ionic complex crystal and the neutral complex crystal are the mixed-stacked charge-transfer complex crystal.

6. The organic thin film device according to claim 1, wherein the ionic complex crystal is separate stacked complex crystal, and the neutral complex crystal is the mixed-stacked charge-transfer complex crystal.

7. The organic thin film device according to claim 1, wherein $I-E-|E_M|$ is 0.1 eV or less where I is the average value of the ionization potential of the donor, E is the average value of the electron affinity of the acceptor, and $E_M$ is Madelung energy.

8. The organic thin film device according to claim 1, wherein the plural thin films forming mixed crystal are laminated with interposing other organic thin films therebetween.

9. The organic thin film device according to claim 8, wherein the plural organic thin films consist of two or more mixed crystals.

10. The organic thin film device according to claim 1, wherein the plural thin films forming mixed crystal are laminated with interposing insulating layers therebetween.

11. The organic thin film device according to claim 1, further comprising an insulating layer and an electrode on both surfaces of the organic thin film forming mixed crystal and used as a display device.

12. The organic thin film device according to claim 1, further comprising:

a silicon substrate;

source and drain portions formed in the silicon substrate;

a gate insulating film formed on the channel region between the source and drain regions;

an organic thin film layer containing an organic thin film forming mixed crystal, formed on the gate insulating film; and a gate electrode formed on the organic thin film layer, and used as a field effect transistor.

13. The organic thin film device according to claim 1, further comprising an organic thin film consisting of donor molecule and an organic thin film consisting of acceptor molecule on both surfaces of the organic thin film forming mixed crystal to form a three-layered structure recording unit, and used as optical recording device.

14. The organic thin film device according to claim 13, further comprising plural recording units having a three-layered structure with different combinations of the donor molecule, the mixed crystal, and the acceptor molecule, and used as multiple optical recording device.

* * * * *